US012669476B2

(12) United States Patent
Ohtsu et al.

(10) Patent No.: US 12,669,476 B2
(45) Date of Patent: Jun. 30, 2026

(54) METHOD OF MANUFACTURING SEMICONDUCTOR DEVICE, METHOD OF WASHING SEMICONDUCTOR MANUFACTURING APPARATUS, AND METHOD OF MEASURING CLEANLINESS OF WASHING SOLUTION

(71) Applicant: FUJIFILM Corporation, Tokyo (JP)

(72) Inventors: Akihiko Ohtsu, Shizuoka (JP); Yukihisa Kawada, Shizuoka (JP); Naotsugu Muro, Shizuoka (JP); Masahiro Yoshidome, Shizuoka (JP); Tetsuya Kamimura, Shizuoka (JP); Ryo Saito, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 715 days.

(21) Appl. No.: 18/173,048

(22) Filed: Feb. 22, 2023

(65) Prior Publication Data

US 2023/0243780 A1 Aug. 3, 2023

Related U.S. Application Data

(63) Continuation of application No. PCT/JP2021/028460, filed on Jul. 30, 2021.

(30) Foreign Application Priority Data

Aug. 31, 2020 (JP) ................................. 2020-145412

(51) Int. Cl.
*G01N 29/036* (2006.01)
*B08B 3/08* (2006.01)
(Continued)

(52) U.S. Cl.
CPC ............. *G01N 29/036* (2013.01); *B08B 3/08* (2013.01); *B08B 13/00* (2013.01); *G03F 7/70925* (2013.01); *H10P 70/00* (2026.01)

(58) Field of Classification Search
CPC ....... G01N 29/036; G01N 2291/02809; G01N 2291/0426; G01N 29/022; G01N 29/4436;
(Continued)

(56) References Cited

U.S. PATENT DOCUMENTS 10,816,141 B2 10/2020 Higuchi et al.
11,079,677 B2 8/2021 Kamimura
(Continued)

FOREIGN PATENT DOCUMENTS

CN 102393405 3/2012
CN 205426853 8/2016
(Continued)

OTHER PUBLICATIONS

"Office Action of China Counterpart Application", issued on Aug. 26, 2025, with English translation thereof, p. 1-p. 23.
(Continued)

*Primary Examiner* — Caleen O Sullivan
(74) *Attorney, Agent, or Firm* — JCIPRNET

(57) ABSTRACT

Provided are a method of manufacturing a semiconductor device in which the purity of a chemical liquid containing an organic solvent is more easily managed, a method of washing a semiconductor manufacturing apparatus, and a simpler method of measuring the cleanliness of a washing solution. A method of manufacturing a semiconductor device has Step 1 of bringing an oscillator into contact with a chemical liquid containing an organic solvent as a main component to obtain the amount of change in the resonance frequency of the oscillator resulting from the contact with the chemical liquid, Step 2 of confirming whether or not the amount of change in the resonance frequency of the chemical liquid falls within a permissible range of the amount of change in the resonance frequency based on the preset purity of the
(Continued)

chemical liquid, and Step 3 of using the chemical liquid confirmed in Step 2 in manufacturing a semiconductor device.

32 Claims, 9 Drawing Sheets

(51) Int. Cl.
*B08B 13/00* (2006.01)
*G03F 7/00* (2006.01)
*H10P 70/00* (2026.01)

(58) Field of Classification Search
CPC ........ G01N 2291/014; G01N 2291/022; B08B 3/08; B08B 13/00; B08B 3/12; G03F 7/70925; H10P 70/00; H10P 72/0414; H10P 72/0604; H10P 70/20; H10P 72/0448; H10P 76/2041; H01L 21/67051; H01L 21/67253; H01L 21/02057; H01L 21/0274; H01L 21/6715; H01L 21/02041
USPC .......................................................... 430/311
See application file for complete search history.

(56) References Cited

U.S. PATENT DOCUMENTS

| | | | |
|---|---|---|---|
| 11,256,173 | B2 | 2/2022 | Kamimura et al. |
| 2018/0299410 | A1 | 10/2018 | Merrill et al. |
| 2019/0324373 | A1 | 10/2019 | Kamimura |
| 2020/0355584 | A1 | 11/2020 | Kamimura |
| 2022/0121123 | A1 | 4/2022 | Kamimura et al. |

FOREIGN PATENT DOCUMENTS

| | | |
|---|---|---|
| EP | 1084402 | 2/2002 |
| JP | H06194290 | 7/1994 |
| JP | 2006266947 | 10/2006 |
| JP | 2012137483 | 7/2012 |
| KR | 1020010052580 | 6/2001 |
| KR | 1020190019007 | 2/2019 |
| KR | 1020190100355 | 8/2019 |
| WO | 2016104433 | 6/2016 |
| WO | 2017169834 | 10/2017 |
| WO | 2018128159 | 7/2018 |
| WO | 2019150967 | 8/2019 |

OTHER PUBLICATIONS

"Office Action of Korean Counterpart Application", issued on Sep. 25, 2024, with English translation thereof, p. 1- p. 17.
"International Search Report (Form PCT/ISA/210) of PCT/JP2021/028460", mailed on Oct. 5, 2021, with English translation thereof, pp. 1-5.
"Written Opinion of the International Searching Authority (Form PCT/ISA/237) of PCT/JP2021/028460", mailed on October 5, 2021, with English translation thereof, pp. 1-6.
"Notice of Final Rejection of Korea Counterpart Application", issued on May 25, 2025, with English translation thereof, p. 1-p. 12.
"The Second Office Action of China Counterpart Application", issued on Jan. 20, 2026, with English translation thereof, p. 1-p. 22.
"Rejection Decision of China Counterpart Application", issued on Mar. 28, 2026, with English translation thereof, p. 1- p. 24.

METHOD OF MANUFACTURING SEMICONDUCTOR DEVICE, METHOD OF WASHING SEMICONDUCTOR MANUFACTURING APPARATUS, AND METHOD OF MEASURING CLEANLINESS OF WASHING SOLUTION

CROSS-REFERENCE TO RELATED APPLICATIONS

This application is a Continuation of PCT International Application No. PCT/JP2021/028460 filed on Jul. 30, 2021, which claims priority under 35 U.S.C. § 119(a) to Japanese Patent Application No. 2020-145412 filed on Aug. 31, 2020. Each of the above applications is hereby expressly incorporated by reference, in their entirety, into the present application.

BACKGROUND OF THE INVENTION

1. Field of the Invention

The present invention relates to a method of manufacturing a semiconductor device, a method of washing a semiconductor manufacturing apparatus, and a method of measuring the cleanliness of a washing solution.

2. Description of the Related Art

A semiconductor device manufacturing process includes various steps such as a lithography step, an etching step, an ion implantation step, and a peeling step. Various chemical liquids such as a developing liquid, a rinsing liquid, a pre-wet liquid, and a peeling liquid used in such a semiconductor device manufacturing process are required to have high purity.

As one of the methods of evaluating the characteristics of a high-purity chemical liquid, there is a method of applying a high-purity chemical liquid on a substrate and measuring the number of defects on the substrate to evaluate the characteristics of the chemical liquid.

For example, in WO2017/169834A, the above evaluation is performed using a surface inspection device (SP-5; made by KLA Tencor).

SUMMARY OF THE INVENTION

Meanwhile, the measurement using the surface inspection device (SP-5; made by KLA Tencor) described in WO2017/169834A has a complicated measurement procedure itself, a long working time, and lacks general-purpose properties.

For that reason, it is not preferable from an industrial point of view to perform the above measurement and measure the purity of the chemical liquid whenever the chemical liquid is produced, and a method of more easily managing the purity of the chemical liquid to be produced is required.

In view of the above circumstances, an object of the present invention is to provide a method of manufacturing a semiconductor device in which the purity of a chemical liquid containing an organic solvent is more easily managed, and a method of washing a semiconductor manufacturing apparatus.

Another object of the present invention is to provide a simpler method of measuring the cleanliness of a washing solution.

In order to achieve the above-described objects, according to one aspect of the present invention, there is provided a method of manufacturing a semiconductor device having: Step 1 of bringing an oscillator into contact with a chemical liquid containing an organic solvent as a main component to obtain an amount of change in a resonance frequency of the oscillator resulting from the contact with the chemical liquid; Step 2 of confirming whether or not the amount of change in the resonance frequency of the chemical liquid falls within a permissible range of the amount of change in the resonance frequency based on a preset purity of the chemical liquid; and Step 3 of using the chemical liquid confirmed in Step 2 in manufacturing a semiconductor device.

It is preferable that the manufacturing of the semiconductor device in Step 3 has a lithography step using the chemical liquid.

It is preferable that a concentration step of concentrating the chemical liquid before Step 1 is further provided.

It is preferable that a step of washing the oscillator before Step 1 is further provided.

It is preferable that in Step 1, the chemical liquid is circulated and supplied to the oscillator, and the oscillator is brought into contact with the chemical liquid to obtain an amount of change in a resonance frequency of the oscillator resulting from the contact with the chemical liquid.

It is preferable that Step 1 is performed while a temperature of the chemical liquid is kept constant.

It is preferable that the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

It is preferable that the oscillator includes a crystal oscillator sensor including an adsorption layer that adsorbs impurities in the chemical liquid and a crystal oscillator, and an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

It is preferable a supply unit that supplies the chemical liquid to the crystal oscillator sensor and brings the chemical liquid into contact with the crystal oscillator sensor is provided, and Step 1 has a step of feeding the chemical liquid to the crystal oscillator sensor to bring the chemical liquid into contact with the crystal oscillator sensor.

It is preferable that the chemical liquid is allowed to flow in one direction to the crystal oscillator sensor to bring the chemical liquid into contact with the crystal oscillator sensor.

It is preferable that in Step 1, at least a part of a liquid contact portion coming into contact with the chemical liquid is made of a fluorine-based resin.

According to one aspect of the present invention, there is provided a method of washing a semiconductor manufacturing apparatus having: Step 1 of bringing an oscillator into contact with a chemical liquid containing an organic solvent as a main component to obtain an amount of change in a resonance frequency of the oscillator resulting from the contact with the chemical liquid; Step 2 of confirming whether or not an amount of change in the resonance frequency of the chemical liquid falls within a permissible range of an amount of change in the resonance frequency based on a preset purity of the chemical liquid; and Step 3 of using the chemical liquid confirmed in Step 2 in washing a semiconductor manufacturing apparatus.

It is preferable that the washing of the semiconductor manufacturing apparatus in Step 3 has a step of feeding the chemical liquid to a liquid feeding unit of the semiconductor manufacturing apparatus.

It is preferable that a concentration step of concentrating the chemical liquid before Step 1 is further provided.

It is preferable that a step of washing the oscillator before Step 1 is further provided.

It is preferable that in Step 1, the chemical liquid is circulated and supplied to the oscillator, and the oscillator is brought into contact with the chemical liquid to obtain the amount of change in a resonance frequency of the oscillator resulting from the contact with the chemical liquid.

It is preferable that Step 1 is performed while a temperature of the chemical liquid is kept constant.

It is preferable that the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

It is preferable that the oscillator includes a crystal oscillator sensor including an adsorption layer that adsorbs impurities in the chemical liquid and a crystal oscillator, and an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

It is preferable a supply unit that supplies the chemical liquid to the crystal oscillator sensor and brings the chemical liquid into contact with the crystal oscillator sensor is provided, and Step 1 has a step of feeding the chemical liquid to the crystal oscillator sensor to bring the chemical liquid into contact with the crystal oscillator sensor.

It is preferable that the chemical liquid is allowed to flow in one direction to the crystal oscillator sensor to bring the chemical liquid into contact with the crystal oscillator sensor.

It is preferable that in Step 1, at least a part of a liquid contact portion coming into contact with the chemical liquid is made of a fluorine-based resin.

According to one aspect of the present invention, there is provided a method of measuring cleanliness of a washing solution having: Step 1 of bringing an oscillator into contact with a chemical liquid containing an organic solvent as a main component to obtain an amount of change in a resonance frequency of the oscillator resulting from the contact with the chemical liquid; Step 2 of confirming whether or not the amount of change in the resonance frequency of the chemical liquid falls within a permissible range of an amount of change in the resonance frequency based on a preset purity of the chemical liquid; Step 3 of using the chemical liquid confirmed in Step 2 in washing a semiconductor manufacturing apparatus; Step 4 of extracting a part of the chemical liquid used for washing in Step 3; and Step 5 of confirming whether or not the amount of change in the resonance frequency of the chemical liquid extracted in Step 4 falls within the permissible range.

It is preferable that a concentration step of concentrating the chemical liquid before Step 1 is further provided.

It is preferable that a step of washing the oscillator before Step 1 is further provided.

It is preferable that in Step 1, the chemical liquid is circulated and supplied to the oscillator, and the oscillator is brought into contact with the chemical liquid to obtain the amount of change in a resonance frequency of the oscillator resulting from the contact with the chemical liquid.

It is preferable that Step 1 is performed while a temperature of the chemical liquid is kept constant.

It is preferable that the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

It is preferable that the oscillator includes a crystal oscillator sensor including an adsorption layer that adsorbs impurities in the chemical liquid and a crystal oscillator, and an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

It is preferable a supply unit that supplies the chemical liquid to the crystal oscillator sensor and brings the chemical liquid into contact with the crystal oscillator sensor is provided, and Step 1 has a step of feeding the chemical liquid to the crystal oscillator sensor to bring the chemical liquid into contact with the crystal oscillator sensor.

It is preferable that the chemical liquid is allowed to flow in one direction to the crystal oscillator sensor to bring the chemical liquid into contact with the crystal oscillator sensor.

It is preferable that in Step 1, at least a part of a liquid contact portion coming into contact with the chemical liquid is made of a fluorine-based resin.

According to the present invention, it is possible to provide a method of manufacturing a semiconductor device in which the purity of a chemical liquid containing an organic solvent is more easily managed, and a method of washing a semiconductor manufacturing apparatus.

In addition, the present invention can provide a simpler method of measuring the cleanliness of a washing solution.

DESCRIPTION OF THE PREFERRED EMBODIMENTS

Hereinafter, a method of manufacturing a semiconductor device, a method of washing a semiconductor manufacturing apparatus, and a method of measuring the cleanliness of a washing solution according to an embodiment of the present invention will be described in detail based on preferred embodiments shown in the accompanying drawings.

In addition, the drawings described below are exemplary for explaining the present invention, and the present invention is not limited to the drawings shown below.

In addition, in the following, "to" indicating a numerical range includes numerical values described on both sides. For example, in a case where c is a numerical value α to a numerical value β, the range of ε is a range including the numerical value α and the numerical value β and is $\alpha \leq \varepsilon \leq \beta$ in mathematical symbols.

A reference to "preparation" is meant to encompass delivering a predetermined material by purchases or the like, in addition to comprising specific materials by synthesis, combination, or the like.

In addition, "ppm" means "parts-per-million ($10^{-6}$)," "ppb" means "parts-per-billion ($10^{-9}$)," "ppt" means "parts-per-trillion ($10^{-12}$)," and "ppq" means "parts-per-quadrillion ($10^{-15}$)."

Angles such as "angles represented by specific numerical values", "parallel", and "orthogonal" include error ranges generally tolerated in the art, unless otherwise described.

In the present invention, a chemical liquid in which the purity such as the amount of impurities is managed is used for manufacturing a semiconductor device or washing a semiconductor manufacturing apparatus.

In addition, in the present invention, the management of the purity such as the amount of impurities in a chemical liquid is utilized to measure the cleanliness of a washing solution. Hereinafter, a semiconductor manufacturing apparatus and the like will be described. Examples of the semiconductor manufacturing apparatus include a coater developer, a spin coater, a semiconductor wafer washing apparatus, and a developing apparatus. Hereinafter, the semiconductor manufacturing apparatus will be described in detail, and the present invention is not limited to the semiconductor manufacturing apparatus shown below.

First Example of Semiconductor Manufacturing Apparatus

Figure 1:
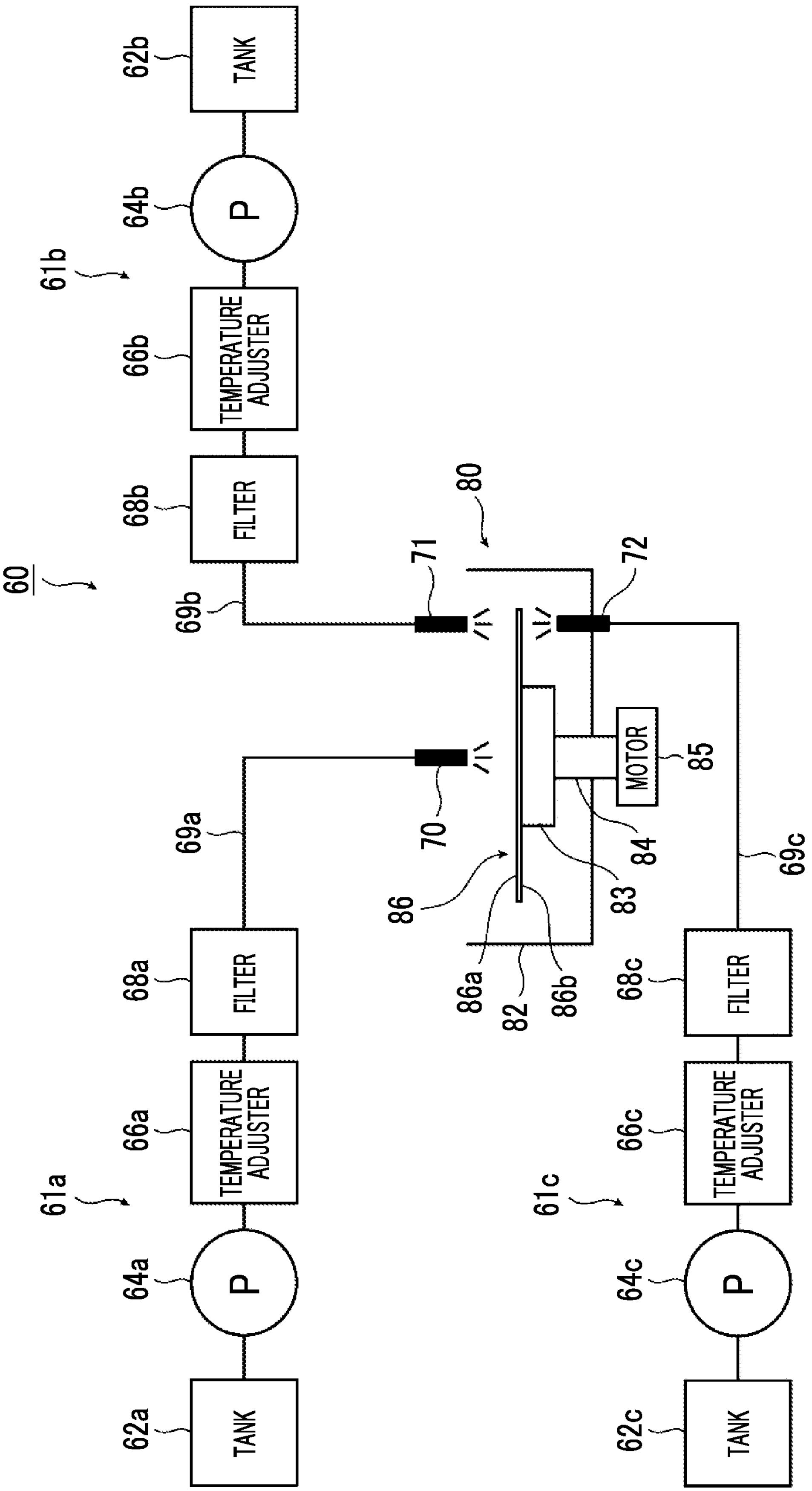
FIG. 1 is a schematic diagram showing a first example of a semiconductor manufacturing apparatus according to an embodiment of the present invention.

FIG. 1 is a schematic diagram showing a first example of a semiconductor manufacturing apparatus according to the embodiment of the present invention.

A semiconductor manufacturing apparatus 60 shown in FIG. 1 is an apparatus that applies a resist liquid to a front surface 86*a* of a semiconductor wafer 86.

The semiconductor manufacturing apparatus 60 has a resist liquid supply unit 61*a* that supplies a resist liquid to the front surface 86*a* of the semiconductor wafer 86 installed in an application unit 80, a rinsing liquid supply unit 61*b* that supplies a rinsing liquid to the front surface 86*a* of the semiconductor wafer 86, and a back rinsing unit 61*c* that supplies a rinsing liquid to a back surface 86*b* of the semiconductor wafer 86.

The resist liquid supply unit 61*a* has, for example, a tank 62*a*, a pump 64*a*, a temperature adjuster 66*a*, a filter 68*a*, and a nozzle 70. The tank 62*a*, the pump 64*a*, the temperature adjuster 66*a*, and the filter 68*a* are connected by a pipe 69*a*, and the nozzle 70 is connected to an end part of the pipe 69*a*.

The tank 62*a* stores a resist liquid. The pump 64*a* supplies the resist liquid in the tank 62*a* to the front surface 86*a* of the semiconductor wafer 86 from the nozzle 70 through the temperature adjuster 66*a* and the filter 68*a*.

The temperature adjuster 66*a* adjusts the temperature of the resist liquid. The filter 68*a* removes impurities in the resist liquid. The resist liquid supply unit 61*a* may have a suck-back in order to prevent the resist liquid from dripping.

The rinsing liquid supply unit 61*b* has, for example, a tank 62*b*, a pump 64*b*, a temperature adjuster 66*b*, a filter 68*b*, and a nozzle 71. The tank 62*b*, the pump 64*b*, the temperature adjuster 66*b*, and the filter 68*b* are connected by a pipe 69*b*, and the nozzle 71 is connected to an end part of the pipe 69*b*.

The rinsing liquid supply unit 61*b* has the same configuration as the resist liquid supply unit 61*a*, except that as compared with the resist liquid supply unit 61*a*, the rinsing liquid is supplied to an end part of the front surface 86*a* of the semiconductor wafer 86 instead of the resist liquid, and the nozzle 71 is disposed at a different position.

The rinsing liquid is stored in the tank 62*b*. The pump 64*b* supplies the rinsing liquid in the tank 62*b* to the front surface 86*a* of the semiconductor wafer 86 from the nozzle 71 through the temperature adjuster 66*b* and the filter 68*b*. The temperature adjuster 66*b* adjusts the temperature of the rinsing liquid.

The rinsing liquid supply unit 61*b* may have a suck-back in order to prevent the rinsing liquid from dripping.

The back rinsing unit 61*c* has the same configuration as the rinsing liquid supply unit 61*b*, except for the position of the nozzle 72 disposed.

A tank 62*c*, a pump 64*c*, a temperature adjuster 66*c*, a filter 68*c*, a pipe 69*c*, and a nozzle 72 of the back rinsing unit 61*c* have the same configuration as the tank 62*b*, the pump 64*b*, the temperature adjuster 66*b*, the filter 68*b*, the pipe 69*b*, and the nozzle 71 of the rinsing liquid supply unit 61*b*, respectively.

The rinsing liquid is stored in the tank 62*c*, and the rinsing liquid in the back rinsing unit 61*c* is also referred to as a back rinsing liquid.

The shape of the tanks 62*a*, 62*b*, and 62*c* is not particularly limited, and can be optionally selected from shapes used as containers for storing the chemical liquid according to an amount of the chemical liquid to be stored and the like. Examples of the container include bottle-shaped containers having a capacity of several hundred mL to about 20 L (example: "PURE BOTTLE" made by KODAMA PLASTICS Co., Ltd.); drums or pails having a capacity of about 20 to about 200 L (example: "PURE DRUM" and "PURE PAIL" all made by KODAMA PLASTICS Co., Ltd.); totes having a capacity of about 1,000 L (example: "POWER TOTE" made by KODAMA PLASTICS Co., Ltd.); and tank containers having a capacity of about 15,000 to 25,000 L (examples thereof include an "ISO container" whose size and the like are defined by the international standards ISO). The tank is not limited to the above examples, and the capacity, shape, and the like of the tank can be optionally changed.

The type of the pumps 64*a*, 64*b*, and 64*c* is not particularly limited, and examples thereof include positive displacement pumps, mixed flow pumps, axial flow pumps, and centrifugal pumps.

The temperature adjusters 66*a*, 66*b*, and 66*c* are not particularly limited, and may be so-called in-line type heaters that may be provided outside the pipe and are provided inside the pipe.

The application unit 80 has a storage container 82. A support table 83 on which the semiconductor wafer 86 is placed is provided in the storage container 82. The support table 83 fixes the semiconductor wafer 86 by, for example, vacuum suction or the like. In addition, the support table 83 is provided with a drive shaft 84. The drive shaft 84 is connected to a motor 85. The drive shaft 84 is rotated by the motor 85, and thus the support table 83 is rotated and the semiconductor wafer 86 is rotated.

The nozzle 70 that supplies the resist liquid is disposed above the support table 83. The nozzle 71 that supplies the rinsing liquid is disposed at a position of a peripheral portion of the semiconductor wafer 86. The nozzle 72 is disposed to face the nozzle 71.

In the semiconductor manufacturing apparatus 60, the resist liquid is added dropwise from the nozzle 70 to the front surface 86*a* of the fixed semiconductor wafer 86. The semiconductor wafer 86 is rotated by the motor 85 at a predetermined rotation speed. A resist film is formed on the front surface 86*a* of the semiconductor wafer 86 using a centrifugal force. Next, the rinsing liquid is continuously supplied from the nozzle 71 until the resist film on the peripheral portion of the rotating semiconductor wafer 86 is removed, and the resist film on the peripheral portion of the semiconductor wafer 86 is removed.

In addition, in a case where the resist film is formed, the resist liquid may flow to the back surface 86*b* of the semiconductor wafer 86. In this case, the rinsing liquid is supplied from the nozzle 72 to the back surface 86*b* of the semiconductor wafer 86 to remove the resist liquid.

After the resist film is formed on the front surface 86*a* of the semiconductor wafer 86, the semiconductor wafer 86 is detached from the support table 83. The semiconductor wafer 86 is transported to, for example, a pre-baked portion of a photoresist by an automatic transport mechanism (not shown), and the next step is performed.

In the semiconductor manufacturing apparatus 60, the resist liquid and the rinsing liquid are used. The rinsing liquid is managed by measuring the amount of change in the resonance frequency as described below. The amount of change in the resonance frequency correlates with the amount of impurities in the rinsing liquid. The rinsing liquid in which the purity such as the amount of impurities is managed as above can be more easily used.

In addition, in the semiconductor manufacturing apparatus 60, a chemical liquid in which the amount of change in the resonance frequency is managed as described below is used for washing the semiconductor manufacturing apparatus. The chemical liquid in which the purity such as the amount of impurities is managed as above can be more easily used for washing.

Furthermore, after washing using the chemical liquid in which the amount of change in the resonance frequency is managed as described below, a part of the chemical liquid used for washing is extracted, and whether or not the amount of change in the resonance frequency of the extracted chemical liquid falls within a permissible range is confirmed. In a case where the amount of change in the resonance frequency of the extracted chemical liquid falls within the permissible range, the washing is terminated.

In a case where the amount of change in the resonance frequency of the extracted chemical liquid is not included in the permissible range, the washing is performed again using the chemical liquid. The washing is repeatedly performed until the amount of change in the resonance frequency of the extracted chemical liquid falls within the permissible range. As a result, it is possible to perform the washing in which the amount of impurities is managed.

Second Example of Semiconductor Manufacturing Apparatus

Figure 2:
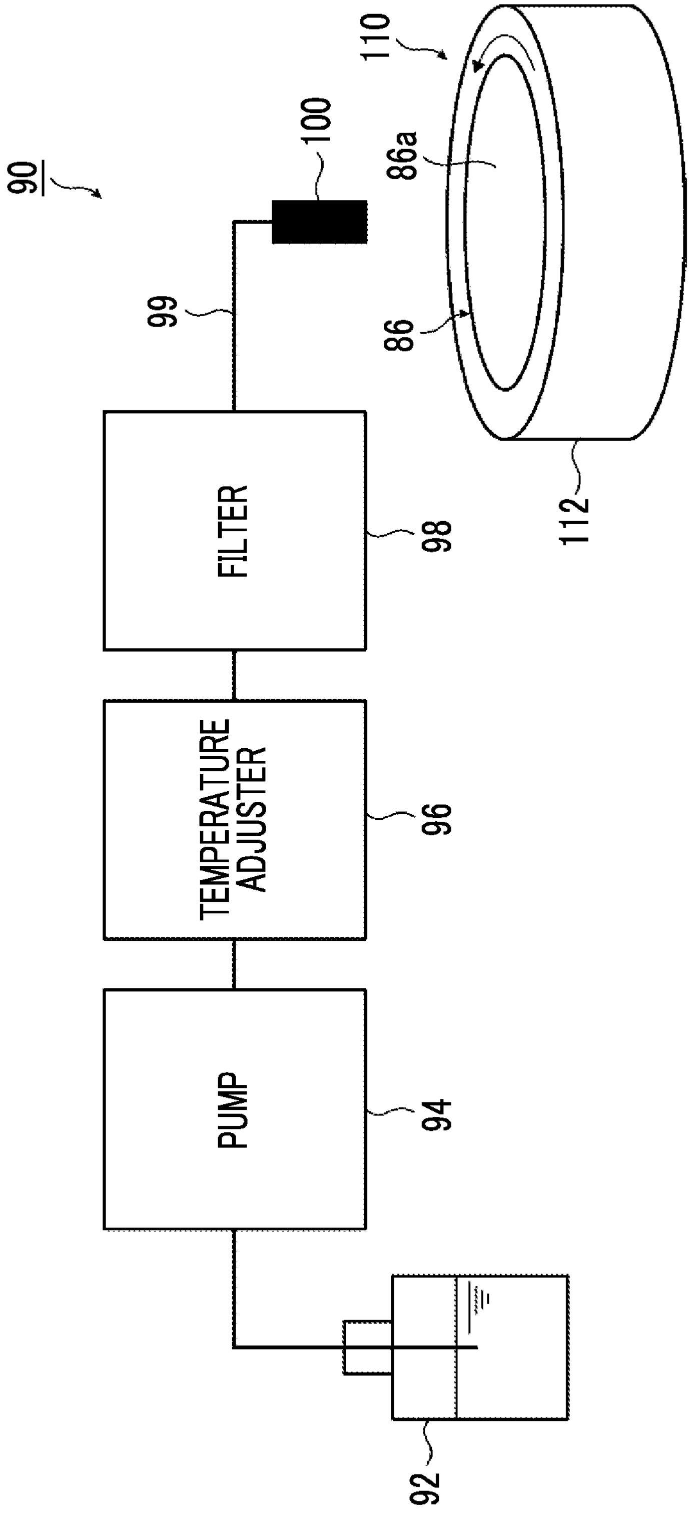
FIG. 2 is a schematic diagram showing a second example of the semiconductor manufacturing apparatus according to the embodiment of the present invention.
Figure 3:
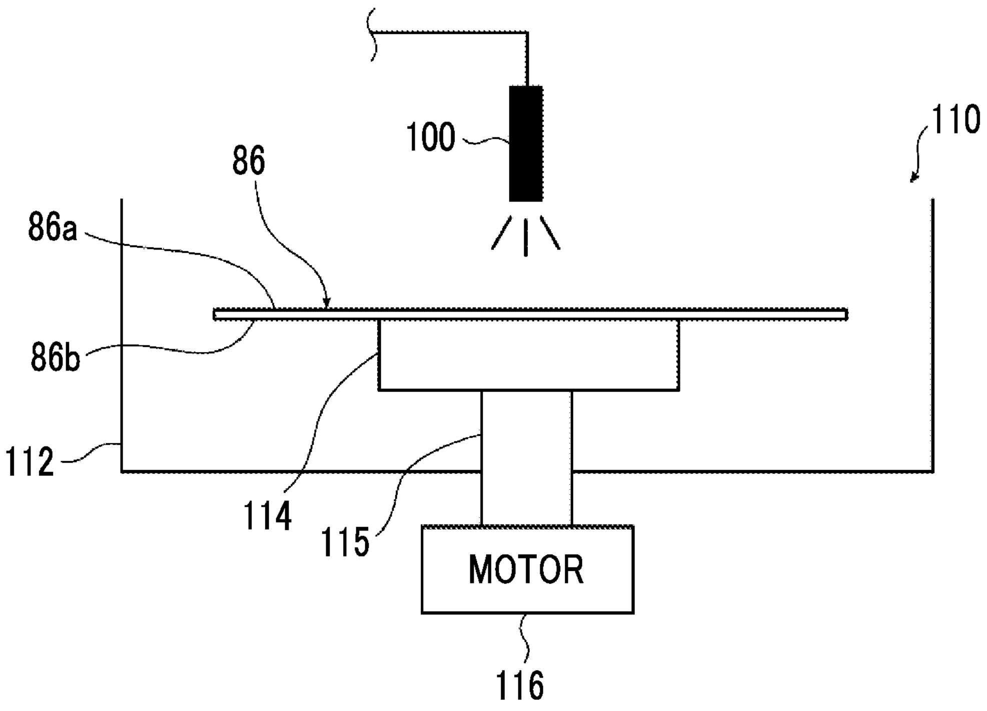
FIG. 3 is a schematic diagram showing a semiconductor wafer washing unit of the second example of the semiconductor manufacturing apparatus according to the embodiment of the present invention.

FIG. 2 is a schematic diagram showing a second example of the semiconductor manufacturing apparatus according to the embodiment of the present invention, and FIG. 3 is a schematic diagram showing a semiconductor wafer washing unit of the second example of the semiconductor manufacturing apparatus according to the embodiment of the present invention.

A semiconductor manufacturing apparatus 90 shown in FIG. 2 is a washing apparatus for a semiconductor wafer 86.

The semiconductor manufacturing apparatus 90 has a tank 92, a pump 94, a temperature adjuster 96, a filter 98, a nozzle 100, and a washing unit 110.

The tank 92, the pump 94, the temperature adjuster 96, and the filter 98 are connected by a pipe 99, and the nozzle 100 is connected to an end part of the pipe 99.

The tank 92 stores a washing solution. The pump 94 supplies the washing solution in the tank 92 to a front surface 86*a* of the semiconductor wafer 86 from the nozzle 100 through the temperature adjuster 96 and the filter 98.

The temperature adjuster 96 adjusts the temperature of the washing solution. The filter 98 removes impurities in the washing solution.

As shown in FIG. 3, the washing unit 110 has a storage container 112. A support table 114 on which the semiconductor wafer 86 is placed is provided in the storage container 112. The support table 114 fixes the semiconductor wafer 86 by vacuum suction or the like. In addition, the support table 114 is provided with a drive shaft 115. The drive shaft 115 is connected to a motor 116. The drive shaft 115 is rotated by the motor 116, and thus the support table 114 is rotated and the semiconductor wafer 86 is rotated.

The nozzle 100 that supplies the washing solution is disposed above the support table 114.

In the semiconductor manufacturing apparatus 90, the semiconductor wafer 86 is rotated by the motor 116 at a predetermined rotation speed. While the semiconductor wafer 86 is rotated, the washing solution is supplied from the nozzle 100 to the front surface 86*a* of the semiconductor wafer 86 through the temperature adjuster 96 and the filter 98 by the pump 94 to wash the semiconductor wafer 86.

In the semiconductor manufacturing apparatus 90, a washing solution is used. The washing solution is managed by measuring the amount of change in the resonance frequency as described below. The amount of change in the resonance frequency correlates with the amount of impurities in the washing solution. The washing solution in which the purity is managed as above can be more easily used for washing.

In addition, in the semiconductor manufacturing apparatus 90, a chemical liquid in which the amount of change in the resonance frequency is managed as described below is used for washing the semiconductor manufacturing apparatus. The washing solution in which the purity such as the amount of impurities is managed as above can be more easily used.

Furthermore, after washing using the chemical liquid in which the amount of change in the resonance frequency is managed as described below, a part of the chemical liquid used for washing is extracted, and whether or not the amount of change in the resonance frequency of the extracted chemical liquid falls within a permissible range is confirmed. In a case where the amount of change in the resonance frequency of the extracted chemical liquid falls within the permissible range, the washing is terminated.

In a case where the amount of change in the resonance frequency of the extracted chemical liquid is not included in the permissible range, the washing is performed again using the chemical liquid. The washing is repeatedly performed until the amount of change in the resonance frequency of the extracted chemical liquid falls within the permissible range. As a result, it is possible to perform the washing in which the amount of impurities is managed.

The semiconductor manufacturing apparatus is not limited to the above-described apparatus, and may be a developing apparatus that subjects a resist film to pattern exposure, and then removes an unexposed portion. The developing apparatus stores a developing liquid in the tank 92 in the semiconductor manufacturing apparatus 90 shown in FIG. 2. Next, the developing liquid is supplied to the resist film on the front surface 86*a* of the semiconductor wafer 86 with no rotation of the semiconductor wafer 86 in which the resist film is formed on the front surface 86*a*. Next, the semiconductor wafer 86 is rotated to spread the developing liquid over the entire surface of the resist film. After the developing liquid spreads over the entire surface of the resist film, the rotation of the semiconductor wafer 86 is stopped. The developing liquid dissolves and removes the unexposed portion.

Next, the semiconductor wafer 86 is rotated at a speed higher than in the case where the developing liquid is spread over the entire surface of the resist film, and the developing liquid is thus removed. Accordingly, an exposure pattern is formed on the resist film. The developing liquid remaining on the semiconductor wafer 86 may be removed using, for example, pure water while the rotation of the semiconductor wafer 86 is maintained.

Furthermore, the semiconductor manufacturing apparatus may be an apparatus capable of performing a rinsing step which is followed by the development. The rinsing step is a step of applying a rinsing liquid to the resist film after the developing step.

In addition, the semiconductor manufacturing apparatus may have a configuration not using a pump, but using, for example, gas pressure feeding in transportation of the liquid in the tank. In addition, a configuration in which the temperature adjuster or the filter is not provided may also be employed. The arrangement order of the pump, the temperature adjuster, and the filter is not particularly limited. Furthermore, a configuration in which a plurality of filters and the like are provided may be provided.

In a case where the semiconductor manufacturing apparatus is washed, a chemical liquid is allowed to flow from the tank to perform flushing washing. The portions to be washed include all portions from the tank to the nozzle. That is, the parts to be washed include liquid feed pipes, liquid contact surfaces inside the pump, liquid contact surfaces inside the temperature adjuster, inner walls of the housing of the filter, the filter itself, liquid contact portions of the nozzle, and liquid contact portions of the tank.

[Use of Chemical Liquid]

A chemical liquid containing an organic solvent as a main component is used in the method of manufacturing a semiconductor device, the method of washing a semiconductor manufacturing apparatus, and the method of measuring the cleanliness of a washing solution. Specifically, the chemical liquid is used as, for example, a developing liquid, a rinsing liquid, or a pre-wet liquid. In addition, the chemical liquid is used as an edge rinsing liquid, a back rinsing liquid, a resist stripper, or a thinner for dilution.

The pre-wet liquid is supplied onto a semiconductor wafer before a resist film is formed. It is used to facilitate spreading of the resist liquid on the semiconductor wafer 86, and to form a uniform resist film with a smaller amount of the resist liquid supplied.

The edge rinsing liquid refers to a rinsing liquid that is supplied to the peripheral portion of a semiconductor wafer and is used to remove the resist film on the peripheral portion of the semiconductor wafer.

For example, butyl acetate (nBA) is used as the developing liquid. Butyl acetate (nBA) can also be used as a washing solution for a pipe, a washing solution for a semiconductor wafer, and the like, in addition to the developing liquid.

In addition, 4-methyl-2-pentanol (MIBC) is used as the rinsing liquid. Propylene glycol monomethyl ether acetate (PGMEA) or isopropanol (IPA) is used as the washing solution. Cyclohexanone (CHN) is used as the pre-wet liquid.

Hereinafter, a measuring device for the chemical liquid will be described.

[Measuring Device]

Figure 4:
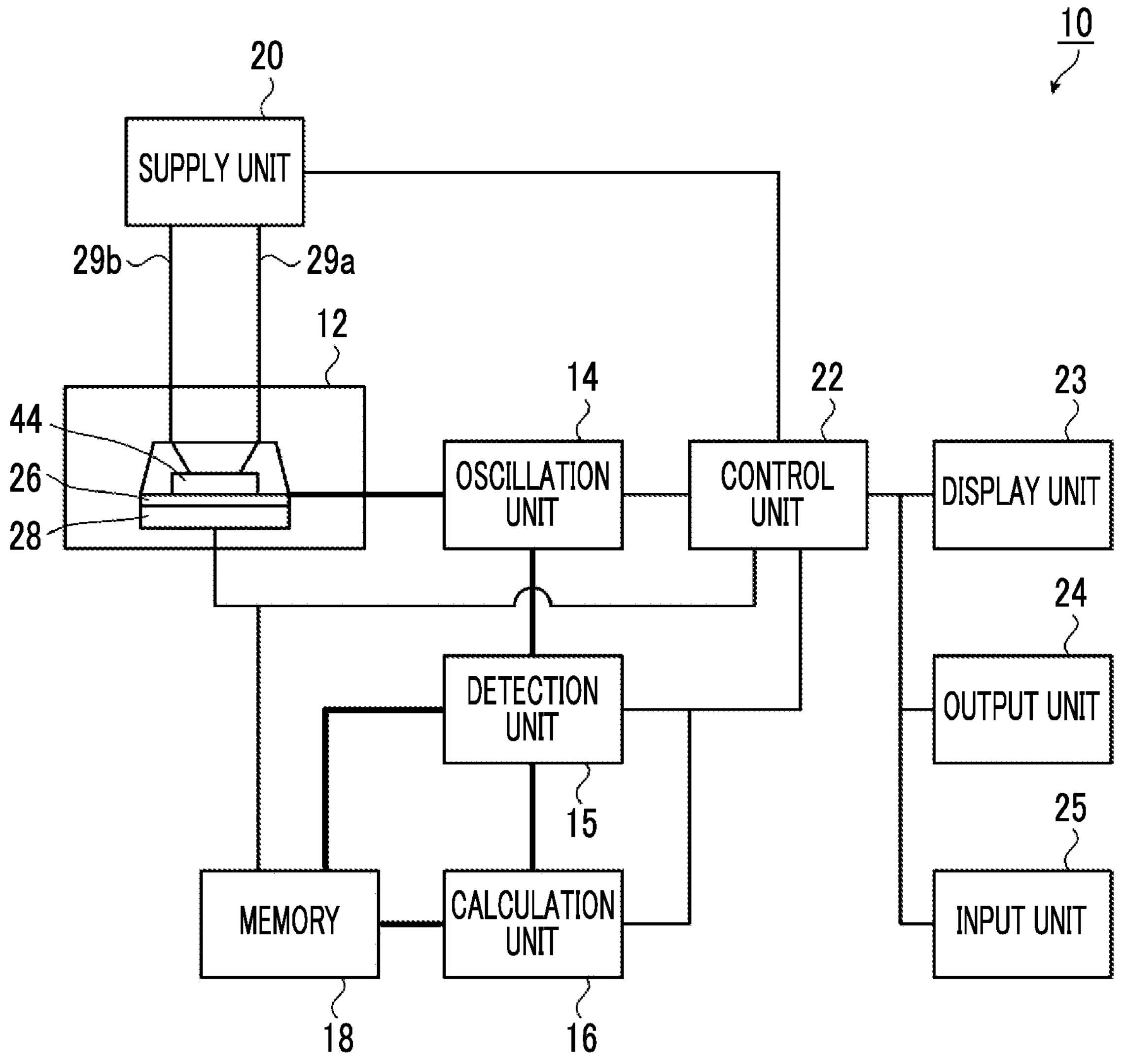
FIG. 4 is a schematic diagram showing an example of a measuring device according to the embodiment of the present invention.
Figure 5:
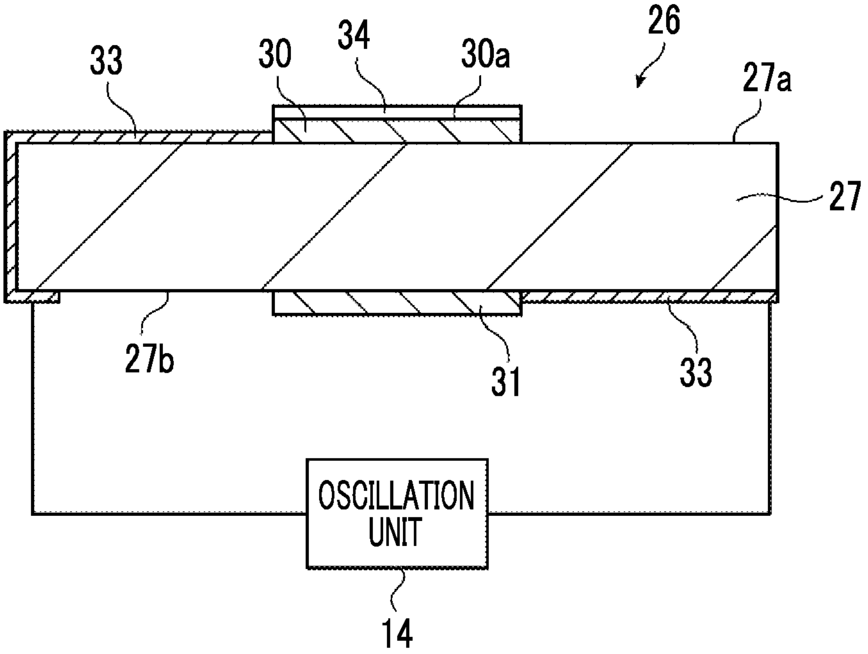
FIG. 5 is a schematic cross-sectional view showing a first example of a crystal oscillator sensor according to the embodiment of the present invention.

FIG. 4 is a schematic diagram showing an example of a measuring device according to the embodiment of the present invention, and FIG. 5 is a schematic cross-sectional view showing a first example of a crystal oscillator sensor according to the embodiment of the present invention.

A measuring device 10 shown in FIG. 4 is a device that senses impurities in a chemical liquid containing an organic solvent. The measuring device 10 can be used to manage the purity of a target chemical liquid.

The measuring device 10 includes a flow cell unit 12, an oscillation unit 14, a detection unit 15, a calculation unit 16, a memory 18, a supply unit 20, and a control unit 22. The measuring device 10 further has a display unit 23, an output unit 24, and an input unit 25.

The control unit 22 controls the operations of the flow cell unit 12, the oscillation unit 14, the detection unit 15, the calculation unit 16, the memory 18, and the supply unit 20. Additionally, the control unit 22 controls respective components of the measuring device 10 on the basis of the control of the operations of the display unit 23 and the output unit 24, and the input information from the input unit 25.

The flow cell unit 12 has a crystal oscillator sensor 26 including an adsorption layer 34 (refer to FIG. 5) that adsorbs the impurities and a crystal oscillator 27 (refer to FIG. 5), and a temperature adjustment unit 28 for maintaining the temperature of the target chemical liquid supplied to the flow cell unit 12. The flow cell unit 12 will be described in detail below.

The oscillation unit 14 is electrically connected to the crystal oscillator sensor 26. The oscillation unit 14 oscillates the crystal oscillator 27 at a resonance frequency. The oscillation unit 14 applies a high-frequency signal of a sine wave to the crystal oscillator sensor 26 as a frequency signal, and has an oscillation circuit (not shown).

Additionally, the detection unit 15 is electrically connected to the oscillation unit 14. The detection unit 15 measures the resonance frequency of the crystal oscillator 27 and detects the amount of change in the resonance frequency of the crystal oscillator resulting from the contact with the target chemical liquid. In addition, the detection unit 15 may detect a difference in the amount of change in the plurality of resonance frequencies obtained by using the plurality of adsorption layers, which will be described below.

The detection unit 15 takes in the frequency signal of the oscillation unit 14, samples the frequency signal, for example, every second, and stores the sampled frequency signal in a memory 18 as time-series data. In addition, the memory 18 stores measurement time and frequency tolerance. On the basis of the measurement time and the frequency tolerance, the detection unit 15 measures the resonance frequency of the crystal oscillator 27 and detects the amount of change in the resonance frequency of the crystal oscillator resulting from the contact with the target chemical liquid.

The measurement time is the time required to obtain the amount of change in the resonance frequency resulting from the contact of the impurities with the adsorption layer 34. The measurement time is not particularly limited and is appropriately determined depending on the supply flow rate of the target chemical liquid, or the like. For example, 10 minutes or more is preferable, and 30 minutes or more is preferable. An upper limit is not particularly limited, but from the viewpoint of productivity, 3 hours or less is preferable, and 2 hours or less is more preferable.

The frequency tolerance is a threshold value for determining whether or not a value that is an index of frequency stabilization has become a sufficiently small value equivalent to the stabilization in a case where whether or not the frequency is stable is determined. The frequency tolerance is appropriately set depending on, for example, set measurement sensitivity. For example, in a case where the resonance frequency is 30 MHz, an error range allowed in the measurement time in a case where the measurement sensitivity is 5 Hz is set to, for example, 0.5 Hz. This is equivalent to 0.0167 ppm. The tolerance corresponding to the error range is equal to or less than $1.67\times10^{-8}$ (0.0167 ppm).

The detection unit 15 detects the frequency by, for example, a frequency counter that is a known circuit. In addition, for example, as described in JP2006-258787A, the frequency may be detected by using a method in which a frequency signal is analog-to-digital converted and processed by a carrier move to generate a rotation vector that rotates at the frequency of the frequency signal, and the velocity of the rotation vector is obtained. In the detection unit 15, it is preferable to use such digital processing because the detection accuracy of the frequency is high.

The calculation unit 16 reads out the permissible range of the amount of change in the resonance frequency based on the preset purity of the target chemical liquid stored in the memory 18, and compares the permissible range of the amount of change in the resonance frequency stored in the memory 18 with the amount of change in the resonance frequency obtained by the detection unit 15 to manage the purity of the chemical liquid. For example, in a case where the amount of change in the resonance frequency is within the permissible range through the above-described comparison, the display unit 23 displays that the purity of the chemical liquid is within a permissible range. On the other hand, in a case where the amount of change in the resonance frequency exceeds the permissible range, the display unit 23 displays that the purity of the chemical liquid exceeds the permissible range. In addition to this, in a case where the amount of change in the resonance frequency is within the permissible range, an event in which the purity of the chemical liquid is within the permissible range may be output to the output unit 24. On the other hand, in a case where the amount of change in the resonance frequency exceeds the permissible range, an event in which the purity of the chemical liquid exceeds the permissible range may be output to the output unit 24.

The memory 18 stores the above-described amount of change in the resonance frequency based on the preset purity of the target chemical liquid and the permissible range thereof. In addition to this, the memory 18 may store the resonance frequency of the crystal oscillator, or the like. As will be described below, in a configuration in which a plurality of electrodes are provided on the crystal oscillator, the resonance frequency of each electrode and the difference in the resonance frequency between the electrodes may be stored.

Figure 6:
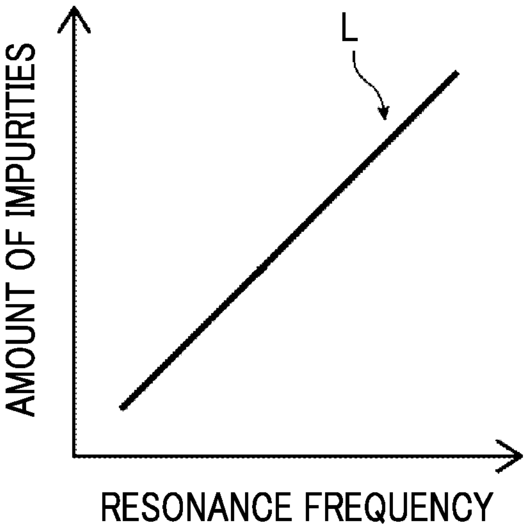
FIG. 6 is a graph showing an example of a calibration curve showing a relationship between the amount of impurities and the resonance frequency of a crystal oscillator.

In addition, as for the amount of change in the resonance frequency stored in the memory 18, for example, as shown in FIG. 6, a calibration curve L showing the relationship between the amount of impurities in a specific target chemical liquid and the resonance frequency of the crystal oscillator 27 can be found, and on the basis of the calibration curve L, the relationship between the amount of impurities in the specific target chemical liquid and the amount of change in the resonance frequency can be obtained. Additionally, by setting the permissible range for the calibration curve L, the permissible range of the amount of change in the resonance frequency can be set. The amount of impurities on the calibration curve L shown in FIG. 6 is, for example, the amount of impurities measured using a surface inspection device. More specifically, after a predetermined amount of the target chemical liquid is applied to a predetermined substrate (for example, a silicon wafer), the number of defects on the substrate to which the target chemical liquid has been applied is measured using the surface inspection device, and the number of defects obtained can be used as the amount of impurities.

In addition, examples of the surface inspection device include a device that irradiates a substrate, to which the target chemical liquid has been applied, with a laser beam, detects the laser beam scattered due to defects present on the substrate, and detects impurities present on the substrate. By performing measurement while rotating the substrate during irradiation with the laser beam, the coordinate position of a defect can be derived from the rotation angle of the substrate and the radial position of the laser beam. Examples of such a device include "SP-5" made by KLA Tencor, but may include a surface inspection device (typically a succession machine of "SP-5", or the like) having a resolution equal to or higher than that of "SP-5", in addition to this.

The display unit 23 displays the amount of change in the resonance frequency obtained by the calculation unit 16, and includes, for example, a display. The display is not particularly limited as long as the display can display texts and images, and a liquid crystal display device or the like is used. Additionally, the items displayed on the display unit 23 are not limited to the amount of change in the resonance frequency obtained, but may be a resonance frequency. As will be described below, a difference in the amount of change in a plurality of resonance frequencies obtained by using a plurality of adsorption layers may be displayed, and various setting items, input information, and the like, which are set by the measuring device 10, may be displayed.

The output unit 24 displays the obtained amount of change in the resonance frequency, the resonance frequency, or the like on a medium. More specifically, for example, at least one of texts, symbols, or barcodes is used for display. The output unit 24 includes a printer or the like. An information display unit on which resonance frequency information on the chemical liquid of a set described below is displayed can be obtained by the output unit 24.

The input unit 25 is various input devices for inputting various information from a mouse, a keyboard, and the like according to an operator's instruction. For example, the setting of the measuring device 10 and the call of data from the memory 18 are performed via the input unit 25.

In addition, the input unit 25 also includes an interface for inputting information to be stored in the memory 18, and the information is stored in the memory 18 through an external storage medium or the like.

In addition, the measuring device 10 only needs to be able to obtain the obtained amount of change in the resonance frequency and does not necessarily require a configuration other than obtaining the amount of change in the resonance frequency. From this, for example, the calculation unit 16 is necessary in the management method but is not necessarily required in the measuring device 10 for obtaining the amount of change in the resonance frequency.

The flow cell unit 12 is a sensing unit that senses the impurities in the chemical liquid containing an organic solvent. The flow cell unit 12 is connected to the supply unit 20 by using a first tube 29*a* and a second tube 29*b*. The supply unit 20 allows the target chemical liquid to pass through the first tube 29*a*, supplies the target chemical liquid to the crystal oscillator, and allows the target chemical liquid to pass through the second tube 29*b* to recover the target chemical liquid. The supply unit 20 allows the target chemical liquid to pass through the first tube 29*a* and the second tube 29*b* without coming into contact with the target chemical liquid, and for example, a peristaltic pump is used. The supply unit 20 is not particularly limited as long as the supply unit can feed the liquid without coming into contact with the target chemical liquid, and for example, a syringe pump can be used.

The temperature adjustment unit 28 has, for example, a Peltier element. The temperature of the target chemical liquid is maintained by the Peltier element. Accordingly, the temperature of the target chemical liquid can be kept constant, and the viscosity of the target chemical liquid can be kept within a certain range. Fluctuations in measurement conditions of the purity can be reduced. Therefore, it is preferable to keep the temperature of the target chemical liquid constant and measure the amount of change in the resonance frequency. In addition, the configuration of the temperature adjustment unit 28 is not particularly limited as long as the temperature of the target chemical liquid can be maintained.

In a case where the temperature of the target chemical liquid is kept constant, the temperature is preferably ±0.5° C., more preferably ±0.3° C., and much more preferably ±0.1° C. with respect to the set temperature.

[Crystal Oscillator Sensor]

As described above, the crystal oscillator sensor 26 has the crystal oscillator 27. However, the crystal oscillator 27 has, for example, a disk shape, and an electrode 30 is provided on a front surface 27*a* of the crystal oscillator 27, and an electrode 31 is provided on a back surface 27*b*.

The adsorption layer 34 for adsorbing the impurities is provided on a surface 30*a* of the electrode 30 provided on the front surface 27*a* of the crystal oscillator 27. The target chemical liquid containing an organic solvent as a main component is brought into contact with the adsorption layer 34.

As the crystal oscillator 27, for example, an AT-cut type crystal oscillator is used. The AT-cut type crystal oscillator is an oscillator cut out at an angle of 35° 15' from a Z axis of artificial quartz. The crystal oscillator sensor 26 is not limited to the configuration shown in FIG. 5.

The oscillation unit 14 is electrically connected to the electrode 30 and the electrode 31. The oscillation unit 14 applies a high-frequency signal of a sine wave to the electrodes 30 and 31 as a frequency signal, and has, for example, an oscillation circuit. The crystal oscillator 27 oscillates at the resonance frequency by the oscillation unit 14. The resonance frequency of the crystal oscillator 27 is, for example, 27 MHz or 30 MHz.

The adsorption layer 34 is made of at least one material of, for example, Si, Au, $SiO_2$, SiOC, Cu, Co, W, Ti, TiN, Ta, TaN, or a photosensitive resin composition. The types of impurities that are easily adsorbed differ depending on materials that constitute the adsorption layer. Thus, for example, in a case where the amount of impurities in the target chemical liquid is found by the above-described surface inspection device and the number of defects is associated with the amount of change in the resonance frequency, it is preferable that the substrate to which the chemical liquid used to measure the number of defects with the surface inspection device is applied and the adsorption layer are made of the same material. That is, in a case where an Si layer is used as the adsorption layer, it is preferable to use an Si substrate (silicon wafer) as the substrate.

The adsorption layer 34 can be formed by a vapor phase method such as a sputtering method or a chemical vapor deposition (CVD) method, a coating method, or the like.

In addition, the type of the photosensitive resin composition is not particularly limited, and examples thereof include known photosensitive resin compositions. Examples of components contained in the photosensitive resin composition include a resin having the group that produces a polar group by the action of an acid, and a photoacid generator. The photosensitive resin composition may further contain a basic compound, a hydrophobic resin, or the like.

In the crystal oscillator sensor 26, the resonance frequency of the crystal oscillator 27 changes depending on the amount of impurities adsorbed on the adsorption layer 34. By measuring the resonance frequency before and after contact with the target chemical liquid, the amount of change in the resonance frequency can be obtained. In addition, the amount of change ΔF in the resonance frequency of the crystal oscillator 27 can be expressed by the following equation referred to as the Sauerbrey equation. In the following equation, $F_0$ is the resonance frequency, Δm is mass change amount, ρ is the density of the crystal, μ is the shear stress of the crystal, and A is the area of the electrodes. From the following equation, by increasing the resonance frequency $F_0$ of the crystal oscillator, the mass detection sensitivity can be increased, that is, the measurement accuracy of impurities can be enhanced.

$$\Delta F = -\frac{2F_0^2}{\sqrt{\rho\mu}}\frac{\Delta m}{A}$$

[Flow Cell Unit]

Figure 7:
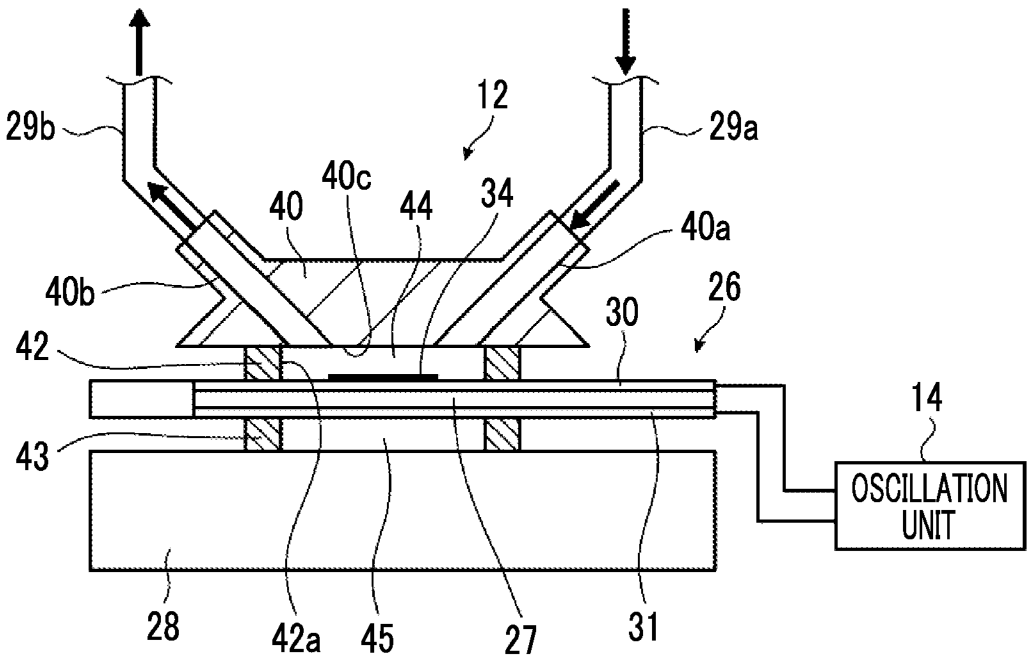
FIG. 7 is a schematic diagram showing an example of a flow cell unit of the measuring device according to the embodiment of the present invention.

FIG. 7 is a schematic diagram showing an example of the flow cell unit of the measuring device according to the embodiment of the present invention.

In the flow cell unit 12, for example, the crystal oscillator sensor 26 is disposed on the temperature adjustment unit 28 via a seal portion 43. The seal portion 42 is provided on the crystal oscillator sensor 26 along the periphery of the crystal oscillator 27. A block 40 is disposed on the seal portion 42. The block 40 is provided with a supply passage 40*a* for supplying the target chemical liquid to the crystal oscillator sensor 26. The supply passage 40*a* is connected to the first tube 29*a*. Additionally, the block 40 is provided with a discharge passage 40*b* for discharging the target chemical liquid from the crystal oscillator sensor 26. The discharge passage 40*b* is connected to the second tube 29*b*. That is, the flow cell unit 12 further has the seal portion 42 disposed on the crystal oscillator sensor 26, the supply passage 40*a* that is disposed on the crystal oscillator sensor 26 via the seal portion 42 and supplies the target chemical liquid to the crystal oscillator sensor 26, the block 40 provided with the discharge passage 40*b* for discharging the target chemical liquid from the crystal oscillator sensor 26, and a liquid feeding unit including the first tube 29*a* connected to the supply passage 40*a* and the second tube 29*b* connected to the discharge passage 40*b*.

The target chemical liquid that has passed through the first tube 29*a* and the supply passage 40*a* is supplied to a region 44 formed by being surrounded by the crystal oscillator sensor 26, the seal portion 42, and the block 40. That is, the seal portion 42 is disposed outside the region 44. Accordingly, the target chemical liquid comes into contact with the adsorption layer 34 on the surface 30*a* of the electrode 30 of the crystal oscillator 27 of the crystal oscillator sensor 26. Additionally, the target chemical liquid passes through the discharge passage 40*b* and the second tube 29*b* and is discharged from the region 44. The first tube 29*a* and the discharge passage 40*b*, and the second tube 29*b* and the discharge passage 40*b* constitute a circulation line.

The movement of the target chemical liquid between the first tube 29*a* and the supply passage 40*a* and the second tube 29*b* and the discharge passage 40*b* is performed by the supply unit 20 (refer to FIG. 4) as described above.

For example, the seal portion 42 and the seal portion 43 have the same size and include, for example, an O-ring. In addition, the target chemical liquid is not supplied to a region 45 formed by being surrounded by the crystal oscillator sensor 26, the seal portion 43, and the temperature adjustment unit 28.

Additionally, in the flow cell unit 12, by making at least a part of a liquid contact portion coming into contact with the target chemical liquid of a fluorine-based resin, elution to the target chemical liquid can be suppressed and a decrease in measurement accuracy of the purity can be suppressed, which is preferable.

In the measuring device 10, a face, which is formed by being surrounded by the crystal oscillator sensor 26, the seal portion 42, and the block 40 and constitutes the region 44 for holding the target chemical liquid on the crystal oscillator sensor 26, corresponds to a part of the liquid contact portion that comes into contact with the target chemical liquid. In addition to the region 44, in the supply unit where the target chemical liquid is brought into contact with the crystal oscillator sensor 26, the portion of the liquid feeding unit that feeds the target chemical liquid to the crystal oscillator sensor is also the liquid contact portion. It is preferable that at least a part of the liquid contact portion is made of the fluorine-based resin. Examples of the liquid feeding unit include a supply line that feeds the liquid in one direction and a circulation line that circulates and supplies the target chemical liquid to the crystal oscillator sensor.

More specifically, the liquid contact portion includes a face 40*c* coming into contact with a region 44 of the block 40 of the flow cell unit 12, a face 42*a* that is a portion coming into contact with the region 44 of the seal portion 42 for holding the target chemical liquid disposed on the crystal oscillator sensor 26 in the region 44, the supply passage 40*a* of the block 40, and the discharge passage 40*b* of the block 40. Additionally, it is preferable that the inside of the first tube 29*a* and the inside of the second tube 29*b* are also liquid contact portions coming into contact with the target chemical liquid, and the portions of the first tube 29*a* and the second tube 29*b* coming into contact with the target chemical liquid are made of the fluorine-based resin.

Particularly, it is preferable that at least a part of the liquid contact portion coming into contact with the target chemical liquid of the seal portion 42, the liquid contact portion coming into contact with the target chemical liquid of the block 40, and the liquid contact portion coming into contact with the target chemical liquid of the liquid feeding unit are made of the fluorine-based resin.

The fluorine-based resin may be any resin containing a fluorine atom.

The fluorine-based resin is not particularly limited as long as the fluorine-based resin is a resin (polymer) containing a fluorine atom, and a known fluorine-based resin can be used. Examples of the fluorine-based resin include polytetrafluoroethylene (PTFE, Tensile strength: 20 to 35 MPa, Shore D Hardness: 50 to 55), perfluoroalkoxyalkane, polychlorotrifluoroethylene, polyvinylidene fluoride, an ethylene tetrafluoroethylene copolymer, an ethylene chlorotrifluoroethylene copolymer, a perfluoroethylene propene copolymer, a tetrafluoroethylene perfluoroalkyl vinyl ether copolymer, and a cyclized polymer of perfluoro (butenyl vinyl ether) (Cytop (registered trademark)).

Particularly, in a case where the liquid contact portion (the portion coming into contact with the target chemical liquid) of the block 40 of the flow cell unit 12 coming into contact with the target chemical liquid is made of a fluorine-based resin, it is preferable that the tensile strength of the fluorine-based resin is 20 to 60 MPa. Additionally, the Shore D hardness of the fluorine-based resin is preferably 60 to 80.

It is preferable that the fluorine-based resin constituting the liquid contact portion coming into contact with the target chemical liquid of the block 40 is perfluoroalkoxyalkane (PFA, tensile strength: 25 to 35 MPa, Shore D hardness: 62 to 66), an ethylene tetrafluoroethylene copolymer (ETFE, tensile strength: 38 to 42 MPa, Shore D hardness: 67 to 78), a perfluoroethylene propene copolymer (FEP, tensile strength: 20 to 30 MPa, Shore D hardness: 60 to 65), polychlorotrifluoroethylene (PCTFE, tensile strength: 31 to 41 MPa, Shore D hardness: 75 to 80), or polyvinylidene fluoride (PVDF, tensile strength: 30 to 70 MPa, Shore D hardness: 64 to 79).

The method of measuring the tensile strength is performed according to Japanese Industrial Standards (JIS) K 7161.

The method of measuring the Shore D hardness is performed according to JIS K 7215.

Additionally, it is preferable that the fluorine-based resin constituting the liquid contact portion (a portion coming into contact with the target chemical liquid) coming into contact with the target chemical liquid in the liquid feeding unit that feeds the target chemical liquid to the region 44 has a repeating unit (hereinafter, also simply referred to as "specific repeating unit") including a fluorine atom, a carbon atom, and an atom other than the fluorine atom and the carbon atom. Examples of the above-described other atoms include a hydrogen atom and a chlorine atom. That is, it is preferable that the specific repeating unit includes the fluorine atom, the carbon atom, and at least one other atom selected from the group consisting of the hydrogen atom and the chlorine atom.

As the fluorine-based resin constituting the portion of the liquid feeding unit coming into contact with the target chemical liquid, a ternary copolymer (THV soft fluororesin) of tetrafluoroethylene, hexafluoropropylene, and vinylidene fluoride, the polyvinylidene fluoride, and the ethylene tetrafluoroethylene copolymer, or the polychlorotrifluoroethylene is preferable.

The method of measuring the tensile strength and the Shore D hardness is as described above.

The portion (the face 42*a* that is a portion coming into contact with the region 44), coming into contact with the target chemical liquid, of the seal portion 42 that holds the target chemical liquid disposed on the crystal oscillator sensor 26 in the region 44 is preferably made of the fluorine-based resin.

The tensile strength of the fluorine-based resin constituting the portion of the seal portion 42 coming into contact with the target chemical liquid is preferably 20 to 40 MPa. Additionally, the Shore D hardness of the fluorine-based resin constituting the portion of the seal portion 42 coming into contact with the target chemical liquid is preferably 56 to 70. Additionally, the bending modulus of the fluorine-based resin constituting the portion of the seal portion 42 coming into contact with the target chemical liquid is preferably 0.5 to 3 GPa.

In a case where the fluorine-based resin constituting the portion of the seal portion 42 coming into contact with the target chemical liquid satisfies the tensile strength, Shore D hardness, and bending modulus, the oscillation of the crystal oscillator sensor 26 is not hindered and more stable measurement can be carried out.

The method of measuring the tensile strength and the Shore D hardness is as described above.

The method of measuring the bending modulus is performed according to JIS K7171.

As the fluorine-based resin constituting the portion of the seal portion 42 coming into contact with the target chemical liquid, include the perfluoroalkoxyalkane, the perfluoroethylene propene copolymer, the ethylene chlorotrifluoroethylene copolymer, the ethylene tetrafluoroethylene copolymer, the polychlorotrifluoroethylene, or, the polyvinylidene fluoride is preferable.

The supply unit 20 circulates the target chemical liquid by using the first tube 29*a* and the second tube 29*b*, but the present invention is not limited to this, and a method of allowing the target chemical liquid to flow in one direction may be used. In this case, for example, a syringe pump can be used.

In a case where the target chemical liquid is circulated and supplied to the crystal oscillator 27, the circulation flow rate of the target chemical liquid is preferably 0.01 to 1,000 ml/s. In a case where the circulation flow rate is 0.01 to 1,000 ml/s, a sufficient amount of impurities to be detected can be attached to the surface of the adsorption layer 34.

In a case where the amount of increase in impurities in a case where the target chemical liquid is circulated for 1 hour is equal to or less than 1,000 mass ppt, it is preferable because the measurement accuracy of the purity does not decrease.

The disposition of the crystal oscillator sensor 26 in the flow cell unit 12 is not particularly limited.

[Method of Manufacturing Semiconductor Device]

A chemical liquid in which the purity is managed by sensing impurities in the chemical liquid containing an organic solvent is used to manufacture a semiconductor device.

A method of manufacturing a semiconductor device has Step 1 of bringing an oscillator into contact with a chemical liquid containing an organic solvent as a main component to obtain the amount of change in a resonance frequency of the oscillator resulting from the contact with the chemical liquid, Step 2 of confirming whether or not the amount of change in the resonance frequency of the chemical liquid falls within a permissible range of the amount of change in the resonance frequency based on the preset purity of the chemical liquid, and Step 3 of using the chemical liquid confirmed in Step 2 in manufacturing a semiconductor device. A step of preparing the chemical liquid containing an organic solvent as a main component before Step 1 may be provided.

As shown in the measuring device 10, in Step 1, at least a part of a liquid contact portion coming into contact with the target chemical liquid is made of a fluorine-based resin.

In addition, in the method of manufacturing a semiconductor device, similar to the above-described measuring device, the target chemical liquid is fed to and brought into contact with the crystal oscillator sensor. The target chemical liquid may be attached to the crystal oscillator sensor by causing the target chemical liquid to flow in one direction. Additionally, the target chemical liquid may be circulated and supplied to the crystal oscillator, and the circulation flow rate of the target chemical liquid may be 0.01 to 1,000 ml/s.

Hereinafter, the method of manufacturing a semiconductor device will be described more specifically by taking the above-described measuring device 10 shown in FIG. 4 as an example. In the method of manufacturing a semiconductor device, for example, a chemical liquid is circulated and supplied.

As described above, a chemical liquid containing an organic solvent for managing the purity is prepared, and the target chemical liquid is stored in the supply unit 20 of the measuring device 10. The impurities are contained in the target chemical liquid.

Next, passing the target chemical liquid through the first tube 29*a* and the supply passage 40*a* of the block 40 from the supply unit 20 to the flow cell unit 12 to supply the target chemical liquid to the region 44, passing the target chemical liquid through the discharge passage 40*b* of the block 40 and the second tube 29*b* to return the target chemical liquid to the supply unit 20, and passing the target chemical liquid through the first tube 29*a* and the supply passage 40*a* of the block 40 again to supply the target chemical liquid the region 44 are carried out repeatedly. Accordingly, the target chemical liquid is circulated and supplied to the crystal oscillator 27 and brought into contact with the adsorption layer 34 of the crystal oscillator 27. In this case, it is preferable to keep the temperature of the target chemical liquid constant.

A high-frequency signal of a sine wave is applied as a frequency signal from the oscillation unit 14 to the crystal oscillator sensor 26, the crystal oscillator 27 is oscillated at a resonance frequency before the supply of the target chemical liquid, and resonance frequency before the supply of the target chemical liquid is obtained by the detection unit 15. Thereafter, for example, after the target chemical liquid is supplied to the crystal oscillator 27 for a predetermined time, the detection unit 15 obtains the resonance frequency and then obtains the amount of change in the resonance frequency (Step 1). That is, the amount of change in the resonance frequency can be obtained by carrying out the method of measuring the chemical liquid having Step 1. The amount of change in the resonance frequency obtained by the detection unit 15 is output to the calculation unit 16 and stored in the calculation unit 16. It is preferable that Step 1 has a step of feeding the target chemical liquid to the crystal oscillator sensor 26 to bring the target chemical liquid into contact with the crystal oscillator sensor 26.

The calculation unit 16 reads out the permissible range of the amount of change in the resonance frequency based on the preset purity of the target chemical liquid stored in the memory 18, and compares the permissible range of the amount of change in the resonance frequency stored in the memory 18 with the amount of change in the resonance frequency obtained by the detection unit 15 to confirm whether the amount of change in the resonance frequency falls within the permissible range (Step 2). Accordingly, the purity of the chemical liquid is managed. For example, in a case where the amount of change in the resonance frequency is within the permissible range through the above-described comparison, the display unit 23 displays that the purity of the chemical liquid is within a permissible range. On the other hand, in a case where the amount of change in the resonance frequency exceeds the permissible range, the display unit 23 displays that the purity of the chemical liquid exceeds the permissible range.

In this manner, the purity of the chemical liquid can be easily obtained, and the purity of the target chemical liquid can be managed on the basis of the obtained purity. Accordingly, the quality of the chemical liquid can be managed.

In addition, the amount of change in the resonance frequency stored in the memory 18 and the permissible range thereof can be obtained on the basis of, for example, the calibration curve L shown in FIG. 6 as described above.

Next, the chemical liquid with the amount of change in the resonance frequency confirmed to fall within the permissible range is used for manufacturing a semiconductor device (Step 3). For example, in the semiconductor manufacturing apparatus 60 shown in FIG. 3, for example, butyl acetate (nBA) is stored in the tank 92 as a developing liquid.

Butyl acetate (nBA) is supplied as a developing liquid to an exposed resist film (not shown) formed on the semiconductor wafer 86, and then the semiconductor wafer 86 is rotated to spread the developing liquid over the entire surface of the resist film. In a case where the resist film is a negative resist film, the unexposed portion is dissolved and removed with the developing liquid. In a case where the resist film is a positive resist film, the exposed portion is dissolved and removed with the developing liquid.

Next, the semiconductor wafer 86 is rotated at a speed higher than in the case where the developing liquid is spread over the entire surface of the resist film, and the developing liquid is thus removed. Accordingly, an exposure pattern is formed on the resist film. The developing liquid remaining on the semiconductor wafer 86 may be removed using, for example, pure water while the rotation of the semiconductor wafer 86 is maintained.

After the development, the semiconductor wafer 86 is transported to the next step. In this manner, the chemical liquid is used for manufacturing a semiconductor device. For example, by using the chemical liquid in the development of the resist film, the resist film can be subjected to the development in a state in which there are no impurities or the like. The development of the resist film is one step in the lithography step.

In addition, a rinsing liquid in which the amount of change in the resonance frequency falls within a permissible range can also be used in the formation of the resist film. The formation of the resist film is also one step in the lithography step.

A concentration step of concentrating the chemical liquid may be performed before Step 1. By concentrating the chemical liquid, the signal intensity of change in the resonance frequency can be increased, and the amount of change in the resonance frequency can be measured with higher sensitivity. The chemical liquid is preferably 3 or more times concentrated, and more preferably 100 or more times concentrated. The upper limit of the concentration is 10,000 times.

The chemical liquid is concentrated by, for example, heating and vaporizing the chemical liquid.

In a case where the amount of change in the resonance frequency is measured as described above, it is preferable to provide a step of washing the oscillator before the measurement of the amount of change in the resonance frequency, for example, before Step 1. By washing the oscillator before the measurement of the amount of change in the resonance frequency, the measurement accuracy of the amount of change in the resonance frequency can be further improved, and a higher correlation can be obtained between the amount of impurities in the chemical liquid and the amount of change in the resonance frequency.

In the step of washing the oscillator, it is preferable to use the same type of chemical liquid as that to be measured for washing the oscillator. Furthermore, the chemical liquid to be used for washing is preferably a liquid having 3 or less defects as measured by a surface inspection device (SP-5; made by KLA Tencor).

Examples of the semiconductor device include the following examples.

[Semiconductor Device]

The semiconductor device is not particularly limited, and examples thereof include a logic large scale integration (LSI) (for example, an application specific integrated circuit (ASIC), a field programmable gate array (FPGA), and an application specific standard product (ASSP)), a microprocessor (for example, a central processing unit (CPU) and a graphics processing unit (GPU)), a memory (for example, a dynamic random access memory (DRAM), a hybrid memory cube (HMC), a magnetic RAM (MRAM: magnetic memory), a phase-change memory (PCM), a resistive RAM (ReRAM: resistive random access memory), a ferroelectric RAM (FeRAM: ferroelectric memory), and a flash memory (not AND (NAND) flash)), a light emitting diode (LED) (for example, a micro flash of a mobile terminal, in-vehicle use, a projector light source, an LCD backlight, and general lighting use), a power device, an analog integrated circuit (IC), (for example, a direct current (DC)-direct current (DC) converter and an insulated gate bipolar transistor (IGBT)), micro electro mechanical systems (MEMS), (for example, a accelerometer, a pressure sensor, an oscillator, and a gyro sensor), wireless (for example, a global positioning system (GPS), frequency modulation (FM), nearfield communication (NFC), an RF expansion module (RFEM), a monolithic microwave integrated circuit (MIMIC), and wireless local area network (WLAN)), a discrete element, back side Illumination (BSI), a contact image sensor (CIS), a camera module, a complementary metal oxide semiconductor (CMOS), a passive device, a surface acoustic wave (SAW) filter, a radio frequency (RF) filter, a radio frequency integrated passive device (RFIPD), and broadband (BB).

[Method of Washing Semiconductor Manufacturing Apparatus]

A chemical liquid in which the purity is managed by sensing impurities in the chemical liquid containing an organic solvent is used to wash a semiconductor manufacturing apparatus.

A method of washing a semiconductor manufacturing apparatus has Step 1 of bringing an oscillator into contact with a chemical liquid containing an organic solvent as a main component to obtain the amount of change in a resonance frequency of the oscillator resulting from the contact with the chemical liquid, Step 2 of confirming whether or not the amount of change in the resonance frequency of the chemical liquid falls within a permissible range of the amount of change in the resonance frequency based on the preset purity of the chemical liquid, and Step 3 of using the chemical liquid confirmed in Step 2 in washing a semiconductor manufacturing apparatus. A step of preparing the chemical liquid containing an organic solvent as a main component before Step 1 may be provided.

The method of washing a semiconductor manufacturing apparatus is the same as the method of manufacturing a semiconductor device described above, except that the chemical liquid confirmed in Step 2 is used for washing the semiconductor manufacturing apparatus (Step 3).

In the method of washing a semiconductor manufacturing apparatus, for example, the semiconductor manufacturing apparatus 90 shown in FIG. 3 is washed.

In the semiconductor manufacturing apparatus 90, for example, isopropanol (IPA) is stored as a washing solution in the tank 92. Isopropanol (IPA) is supplied onto the semiconductor wafer 86 as a washing solution. Then, the semiconductor wafer 86 is rotated to spread the washing solution over the entire surface of the semiconductor wafer 86, and the washing is performed. After the washing, the semiconductor wafer 86 is removed and transferred to the next step.

After the semiconductor wafer 86 is washed, the isopropanol (IPA) confirmed in Step 2 is stored in the tank 92. The isopropanol (IPA) is allowed to pass through the pump 94, the temperature adjuster 96, the filter 98, and the nozzle 100, and discharged from the nozzle 100. In this manner, the semiconductor manufacturing apparatus 90 is washed.

[Method of Measuring Cleanliness of Washing Solution]

The management of the purity of a chemical liquid containing an organic solvent by sensing impurities in the chemical liquid is used in the method of measuring the cleanliness of the washing solution.

The method of measuring the cleanliness of a washing solution has Step 1 of bringing an oscillator into contact with a chemical liquid containing an organic solvent as a main component to obtain the amount of change in a resonance frequency of the oscillator resulting from the contact with the chemical liquid, Step 2 of confirming whether or not the amount of change in the resonance frequency of the chemical liquid falls within a permissible range of the amount of change in the resonance frequency based on the preset purity of the chemical liquid, Step 3 of using the chemical liquid confirmed in Step 2 in washing a semiconductor manufacturing apparatus, Step 4 of extracting a part of the chemical liquid used for washing in Step 3, and Step 5 of confirming whether or not the amount of change in the resonance frequency of the chemical liquid extracted in Step 4 falls within the permissible range. A step of preparing the chemical liquid containing an organic solvent as a main component before Step 1 may be provided.

The method of measuring the cleanliness of the washing solution is the same as the method of washing a semiconductor manufacturing apparatus described above, except that Step 4 of extracting a part of the chemical liquid used for washing in Step 3 after the chemical liquid confirmed in Step 2 is used in washing the semiconductor manufacturing apparatus (Step 3) and Step 5 of confirming whether or not the amount of change in the resonance frequency of the chemical liquid extracted in Step 4 falls within the permissible range are provided.

In the method of measuring the cleanliness of the washing solution, the degree of washing of the semiconductor manufacturing apparatus in the method of washing the semiconductor manufacturing apparatus can be measured, and the degree of contamination of the semiconductor manufacturing apparatus can be grasped.

As described above, for example, in a case where the washing is performed by using the isopropanol (IPA) confirmed in Step 2 as a washing solution in the semiconductor manufacturing apparatus 90 shown in FIG. 3, the isopropanol (IPA) is extracted during washing (Step 4). The amount of change in the resonance frequency of the isopropanol (IPA) extracted in Step 4 is measured. It is confirmed whether or not the amount of change in the resonance frequency falls within the permissible range (Step 5). The isopropanol (IPA) during washing is extracted, but the extraction frequency is not particularly limited. The isopropanol is extracted by, for example, 1/10 of the total amount thereof used for washing.

In Step 4, the isopropanol (IPA) used as the washing solution is extracted to measure the amount of change in the resonance frequency, but the amount of the extracted washing solution is not particularly limited, and for example, about several tens of milliliters to several hundreds of milliliters.

For example, in Step 5, in a case where the amount of change in the resonance frequency falls within the permissible range, the washing is terminated. On the other hand, in Step 5, in a case where the amount of change in the resonance frequency exceeds the permissible range, the washing is not sufficiently performed and continued. In Step 5, the washing is repeatedly performed until the amount of change in the resonance frequency falls within the permissible range. In this manner, by measuring the amount of change in the resonance frequency of the washing solution during washing, the degree of washing of the semiconductor manufacturing apparatus, that is, the degree of contamination of the semiconductor manufacturing apparatus can be grasped.

[Other Examples of Crystal Oscillator Sensor]

Figure 8:
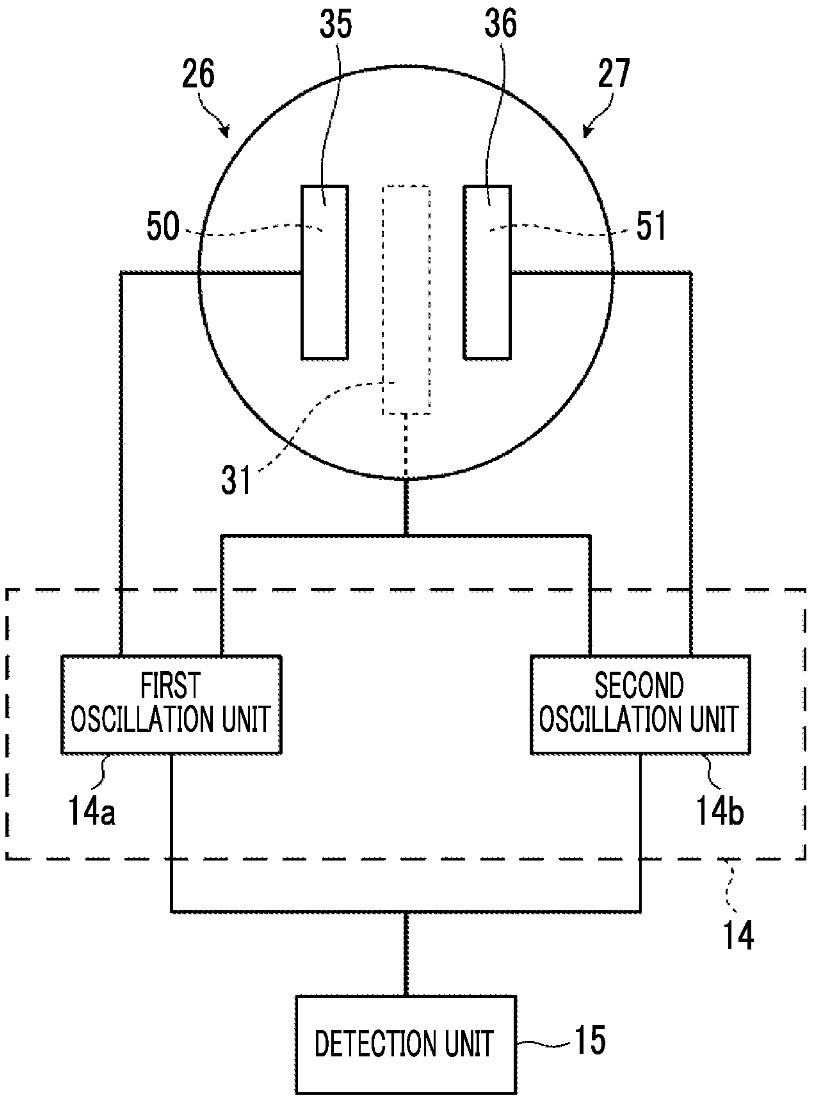
FIG. 8 is a schematic diagram showing a second example of the crystal oscillator sensor according to the embodiment of the present invention.
Figure 9:
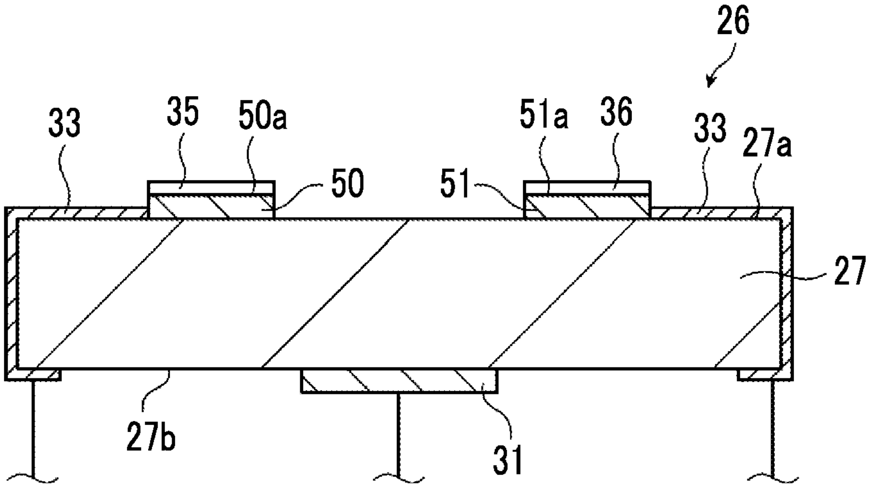
FIG. 9 is a schematic cross-sectional view showing the second example of the crystal oscillator sensor according to the embodiment of the present invention.
Figure 10:
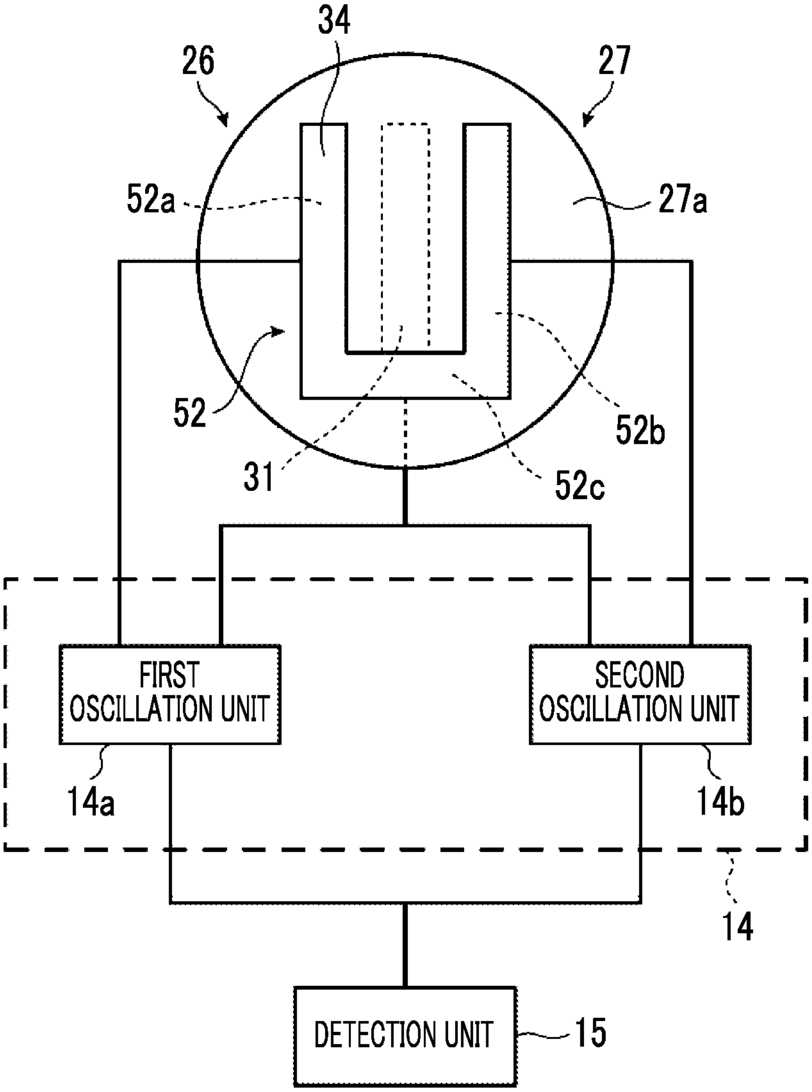
FIG. 10 is a schematic diagram showing a third example of the crystal oscillator sensor according to the embodiment of the present invention.
Figure 11:
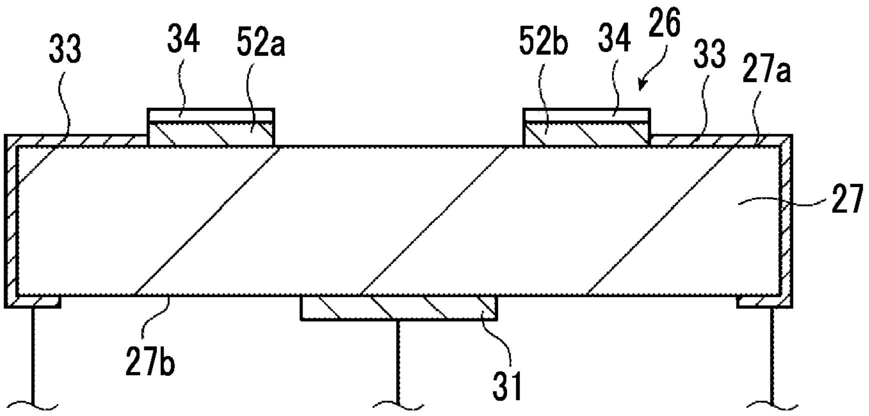
FIG. 11 is a schematic cross-sectional view showing the third example of the crystal oscillator sensor according to the embodiment of the present invention.

FIG. 8 is a schematic diagram showing a second example of the crystal oscillator sensor according to the embodiment of the present invention, and FIG. 9 is a schematic cross-sectional view showing the second example of the crystal oscillator sensor according to the embodiment of the present invention. FIG. 10 is a schematic diagram showing a third example of the crystal oscillator sensor according to the embodiment of the present invention, and FIG. 11 is a schematic cross-sectional view showing the third example of the crystal oscillator sensor according to the embodiment of the present invention. In the crystal oscillator sensor 26 shown in FIGS. 7 to 11, the same components as those of the crystal oscillator sensor 26 shown in FIG. 5 are designated by the same reference signs, and the detailed description thereof will be omitted.

The crystal oscillator sensor 26 shown in FIG. 5 has a configuration in which one electrode 30 is provided on the front surface 27*a* of the crystal oscillator 27, but the present invention is not limited to this. As shown in FIGS. 8 and 9, the first electrode 50 and the second electrode 51 may be configured to be provided on the front surface 27*a* of the crystal oscillator 27. The first electrode 50 and the second electrode 51 are formed of, for example, a rectangular conductive layer, and are disposed parallel to each other at a distance. The first electrode 50 and the second electrode 51 are in a state of being electrically insulated from each other. The first adsorption layer 35 is provided on a surface 50*a* of the first electrode 50, and the second adsorption layer 36 is provided on a surface 51*a* of the second electrode 51.

The first electrode 50 and the electrode 31 are electrically connected to a first oscillation unit 14*a*. The second electrode 51 and the electrode 31 are electrically connected to a second oscillation unit 14*b*. The first oscillation unit 14*a* and the second oscillation unit 14*b* are provided in the oscillation unit 14 and can apply a high-frequency signal of a sine wave to the first electrode 50 and the electrode 31 and the second electrode 51 and the electrode 31 independently of each other as a frequency signal, thereby oscillating the crystal oscillator 27 at the resonance frequency.

Additionally, the first oscillation unit 14*a* and the second oscillation unit 14*b* are electrically connected to the detection unit 15, respectively. The detection unit 15 has a switch unit (not shown) that switches the connection between the first oscillation unit 14*a* and the second oscillation unit 14*b*. The switch unit alternately takes the frequency signal of the first oscillation unit 14*a* and the frequency signal of the second oscillation unit 14*b* into the detection unit 15. Accordingly, the detection unit 15 can independently obtain the resonance frequency of the first electrode 50 and the resonance frequency of the second electrode 51.

The first adsorption layer 35 on the surface 50*a* of the first electrode 50 and the second adsorption layer 36 on the surface 51*a* of the second electrode 51 may be the same or different from each other. In a case where the first adsorption layer 35 and the second adsorption layer 36 are different from each other, a difference in resonance frequency between the first electrode 50 and the second electrode 51 can be used, and the purity can be easily estimated depending on whether or not the difference falls within the permissible range of the amount of change in the resonance frequency based on the preset purity of the target chemical liquid. Accordingly, the purity of the chemical liquid can be more easily obtained, the management of the purity becomes easy, and the quality of the chemical liquid can be easily managed. It is preferable that at least one of the first adsorption layer 35 or the second adsorption layer 36 is a Au layer. By forming the Au layer, one of the first electrode 50 and the second electrode 51 can be used as a reference electrode.

Additionally, as shown in FIGS. 10 and 11, the electrode 52 may be configured to be provided on the front surface 27*a* of the crystal oscillator 27. The electrode 52 has a first electrode portion 52*a*, a second electrode portion 52*b*, and a connecting portion 52*c* that connects the first electrode portion 52*a* and the second electrode portion 52*b* to each other at one end. The first electrode portion 52*a* and the second electrode portion 52*b* are formed of, for example, a rectangular conductive layer, and are disposed parallel to each other at a distance. The first electrode portion 52*a* and the second electrode portion 52*b* are electrically connected to each other. The adsorption layer 34 is provided on the electrode 52.

The first electrode portion 52*a* and the electrode 31 are electrically connected to the first oscillation unit 14*a*. The second electrode portion 52*b* and the electrode 31 are electrically connected to the second oscillation unit 14*b*. The first oscillation unit 14*a* and the second oscillation unit 14*b* are provided in the oscillation unit 14 and can apply a high-frequency signal of a sine wave to the first electrode 50 and the electrode 31 and the second electrode 51 and the electrode 31 independently of each other as a frequency signal, thereby oscillating the crystal oscillator 27 at the resonance frequency.

Additionally, the first oscillation unit 14*a* and the second oscillation unit 14*b* are electrically connected to the detection unit 15, respectively. The detection unit 15 has a switch unit (not shown) that switches the connection between the first oscillation unit 14*a* and the second oscillation unit 14*b*. The switch unit alternately takes the frequency signal of the first oscillation unit 14*a* and the frequency signal of the second oscillation unit 14*b* into the detection unit 15. Accordingly, the detection unit 15 can obtain the resonance frequency of the first electrode portion 52*a* and the resonance frequency of the second electrode portion 52*b* independently of each other.

Also in the crystal oscillator sensor 26 shown in FIG. 11, the adsorption layers 34 are provided on the first electrode portion 52*a* and the second electrode portion 52*b*, but the adsorption layers may be different from each other on the first electrode portion 52*a* and the second electrode portion 52*b*. In a case where the adsorption layers are different, the purity can be easily estimated by using the difference in resonance frequency between the first electrode portion 52*a* and the second electrode portion 52*b*. Accordingly, the purity of the chemical liquid can be more easily obtained, the management of the purity becomes easy, and the quality of the chemical liquid can be easily managed. It is preferable to form a Au layer on at least one of the first electrode portion 52*a* or the second electrode portion 52*b*. By forming the Au layer, one of the first electrode portion 52*a* and the second electrode portion 52*b* can be used as the reference electrode.

The present invention is basically configured as described above. Although the method of manufacturing a semiconductor device, the method of washing a semiconductor manufacturing apparatus, and the method of measuring the cleanliness of a washing solution have been described in detail above, the present invention is not limited to the above-described embodiment and it goes without saying that various improvements or changes may be made without departing from the scope of the present invention.

[Chemical Liquid]

The target chemical liquid (hereinafter, also simply referred to as "chemical liquid") used in the present invention contains an organic solvent as a main component.

In the present specification, the organic solvent is intended to be a liquid organic compound contained in a content exceeding 10,000 mass ppm per component with respect to the total mass of the chemical liquid. That is, in the present specification, the liquid organic compound contained in excess of 10,000 mass ppm with respect to the total mass of the chemical liquid corresponds to the organic solvent.

Additionally, in the present specification, the liquid means a liquid at 25° C. and under atmospheric pressure.

The fact that the organic solvent is a main component in the chemical liquid means that the content of the organic solvent in the chemical liquid is 98.0% by mass or more with respect to the total mass of the chemical liquid, and the content is preferably more than 99.0% by mass, more preferably 99.90% by mass or more, and much more preferably more than 99.95% by mass. The upper limit is less than 100% by mass.

As the organic solvent, one type may be used alone, or two or more types may be used. In a case where two or more types of organic solvents are used, it is preferable that the total content is within the above range.

The type of the organic solvent is not particularly limited, and a known organic solvent can be used. Examples of the organic solvent may include alkylene glycol monoalkyl ether carboxylate, alkylene glycol monoalkyl ether, lactic acid alkyl ester, alkyl alkoxypropionate, cyclic lactone (preferably a carbon number of 4 to 10), a monoketone compound (preferably a carbon number of 4 to 10) that may have a ring, alkylene carbonate, alkyl alkoxyacetate, alkyl pyruvate, dialkyl sulfoxide, cyclic sulfone, dialkyl ether, monohydric alcohol, glycol, alkyl acetate ester, and N-alkylpyrrolidone.

Examples of the organic solvent include, preferably, one or more types selected from the group consisting of propylene glycol monomethyl ether acetate (PGMEA), propylene glycol monomethyl ether (PGME), cyclohexanone (CHN), ethyl lactate (EL), propylene carbonate (PC), isopropanol (IPA), 4-methyl-2-pentanol (MIBC), butyl acetate (nBA), propylene glycol monoethyl ether, propylene glycol monopropyl ether, methyl methoxypropionate, cyclopentanone, γ-butyrolactone, diisoamyl ether, isoamyl acetate, dimethylsulfoxide, N-methylpyrrolidone, diethylene glycol, ethylene glycol, dipropylene glycol, propylene glycol, ethylene carbonate, sulfolane, cycloheptanone, and 2-heptanone.

Examples of using two or more types of organic solvents include the combined use of PGMEA and PGME, and the combined use of PGMEA and PC.

In addition, the type and content of the organic solvent in the chemical liquid can be measured by using a gas chromatograph mass spectrometer.

There is a case where the chemical liquid contains impurities other than the organic solvent. As described above, the resonance frequency changes as the impurities are adsorbed on the adsorption layer.

The impurities include metal impurities and organic impurities.

The metal impurities are intended as metal ions and metal impurities contained in a chemical liquid as a solid (elemental metal, particulate metal-containing compound, or the like).

The type of metal contained in the metal impurities is not particularly limited, and examples thereof include sodium (Na), potassium (K), calcium (Ca), iron (Fe), copper (Cu), magnesium (Mg), manganese (Mn), lithium (Li), aluminum (Al), chromium (Cr), nickel (Ni), titanium (Ti), and zirconium (Zn).

The metal impurities may be components that are inevitably contained in each component (raw material) contained in the chemical liquid, components that are inevitably contained during the manufacturing, storage, and/or transfer of the chemical liquid, or may be added intentionally.

In a case where the chemical liquid contains the metal impurities, the content thereof is not particularly limited and may be 0.01 mass ppq to 500 mass ppb with respect to the total mass of the chemical liquid.

In the present specification, the organic impurities are a compound different from the organic solvent which is a main component contained in the chemical liquid and is intended to be an organic substance contained in a content of 10,000 mass ppm or less with respect to the total mass of the chemical liquid. That is, in the present specification, the organic substance contained in the content of 10,000 mass ppm or less with respect to the total mass of the chemical liquid corresponds to the organic impurities and does not correspond to the organic solvent.

In addition, in a case where the organic impurities including a plurality of types of compounds are contained in the chemical liquid and in a case where each compound corresponds to the above-described organic substance contained in a content of 10,000 mass ppm or less, each compound corresponds to the organic impurities.

In addition, water is not included in the organic impurities.

The organic impurities may be added to the chemical liquid or may be inevitably mixed in the chemical liquid in a producing process of the chemical liquid. Examples of cases in which the organic impurities are inevitably mixed in the producing process of the chemical liquid include a case where the organic impurities are contained in a raw material (for example, the organic solvent) used in the production of the chemical liquid, and a case where mixing is performed in the producing process (for example, contamination) of the chemical liquid, but are not limited thereto.

The total content of organic impurities in the chemical liquid is not particularly limited and may be 0.1 to 5,000 mass ppm with respect to the total mass of the chemical liquid.

As the organic impurities, one type may be used alone, or two or more types may be used in combination. In a case where two or more types of organic impurities are used in combination, the total content is preferably within the above range.

Examples of the organic impurities include an antioxidant such as dibutylhydroxytoluene (BHT), distearylthiodipropionate (DSTP), 4,4'-butylidenebis-(6-t-butyl-3-methylphenol), 2,2'-methylenebis-(4-ethyl-6-t-butylphenol), and the antioxidant described in JP2015-200775A; an unreacted raw material; a structural isomer and by-products produced during the production of the organic solvent; and an eluent from members and the like constituting an apparatus for producing the organic solvent (for example, a plasticizer eluted from a rubber member such as an O-ring).

The chemical liquid may contain water. The type of water is not particularly limited, and for example, distilled water, ion exchange water, and pure water can be used.

Water may be added to the chemical liquid or may be inevitably mixed in the chemical liquid in the producing process of the chemical liquid. Examples of cases in which the organic impurities are inevitably mixed in the producing process of the chemical liquid include a case where water is contained in a raw material (for example, the organic solvent) used in the production of the chemical liquid, and a case where mixing is performed in the producing process (for example, contamination) of the chemical liquid.

The content of water in the chemical liquid is not particularly limited, but is generally preferably 2.0% by mass or less, more preferably 1.0% by mass or less, and much more preferably less than 0.5% by mass, with respect to the total mass of the chemical liquid.

In a case where the water content in the chemical liquid is 1.0% by mass or less, the manufacturing yield of semiconductor chips is more excellent.

In addition, the lower limit is not particularly limited but is about 0.01% by mass in many cases. In terms of production, it is difficult to keep the water content below the lower limit.

The method of preparing the chemical liquid is not particularly limited, and examples thereof include a method of procuring an organic solvent through purchase and the like, and a method of reacting raw materials with each other to obtain an organic solvent. In addition, as the chemical liquid, it is preferable to prepare one having a small content of impurities as described above (for example, one having an organic solvent content of 99% by mass or more). Examples of commercially available products of such organic solvents include those referred to as “high-purity grade products”.

In addition, as necessary, the chemical liquid may be subjected to a purification treatment.

Examples of a purification method include distillation and filtration.

It is preferable that the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

In a case where the total content of the metal elements exceeds 10 mass ppb, no correlation can be obtained in mass ppb measured by a surface inspection device (SP-5; made by KLA Tencor) and ICP-MS or the like, and the determination coefficient is reduced. Meanwhile, the amount of change in the resonance frequency by the crystal oscillator sensor has a correlation with the number of defects obtained by using the surface inspection device (SP-5), and the determination coefficient is high.

In a case where the total content of the metal elements is 0.01 mass ppq to 10 mass ppb, the metal concentration is not too low, and the volume resistance value of the chemical liquid does not increase. As a result, the flow electrification does not increase. Accordingly, in the measuring device or the semiconductor manufacturing apparatus, the chemical liquid can be managed with no occurrence of dielectric breakdown in the fluorine material that is a liquid contact surface and no generation of foreign matter.

The content of Na, K, Ca, Fe, Cu, Mg, Mn, Li, Al, Cr, Ni, Ti, and Zn in the chemical liquid can be measured by using an inductively coupled plasma mass spectrometry (ICP-MS) method using NexION 350 (product name, made by PerkinElmer, Inc.). Specific measurement conditions by the ICP-MS method are as follows. A detection amount is measured at a peak intensity with respect to a standard solution having a known concentration, and converted into the mass of metal components to calculate the content of the metal components (total metal content) in the treatment liquid used for the measurement.

The content of the metal components was measured by a usual ICP-MS method. Specifically, software for ICP-MS is used as software to be used for metal component analysis.

The measurement of 0.01 mass ppq will be described.

First, a 1 mL chemical liquid is applied as liquid droplets on a silicon wafer having a diameter of about 300 mm (12 inches). Then, the chemical liquid is dried without rotation. A position of a defect on the silicon wafer is measured by SP7, and then a cross-section in the vicinity of the defect portion is cut out with FIB-SEM (HELIOS G4-EXL made by Thermo Fisher Scientific Inc.) based on the coordinate file acquired by SP7.

Three-dimensional shape information and element information are acquired by EDX while cross-sectional etching is performed with FIB-SEM or TEM. The above operations are performed on all defects.

For example, in a case where one spherical particle of Fe 13.5 nm (limit of SP7) is found in a 1 mL chemical liquid (density: 1 g/cm$^3$), approximately 0.01 mass ppq can be measured in terms of mass ratio in principle.

EXAMPLES

Hereinafter, the present invention will be described in more detail on the basis of examples. The materials, amounts used, ratios, treatment contents, treatment procedures, and the like shown in the following examples can be appropriately changed as long as they do not depart from the spirit of the present invention. Therefore, the scope of the present invention should not be construed as limiting by the examples shown below.

Example A

[Production of Chemical Liquids]

First, the chemical liquids used in the examples described below were prepared. Specifically, first, high-purity grade organic solvent reagents having a purity of 99% by mass or more were purchased. After that, the purchased reagents were subjected to a filtration treatment in which the following filters were appropriately combined with each other to prepare chemical liquids 1 to 44 having different amounts of impurities.

IEX-PTFE (15 nm): 15 nm IEX PTFE made by Entegris.

PTEE (12 nm): 12 nm PTFE made by Entegris.

UPE (3 nm): 3 nm PE filter made by Entegris.

In addition, in order to adjust the amount of impurities in the chemical liquids described below, a purchase source of the organic solvent reagents was appropriately changed, the purity grade was changed, and the distillation treatment was carried out before the filtration treatment.

[Evaluation Using Crystal Oscillator Sensor (1)]

Example 1

The oscillator was washed with the following chemical liquid for washing. The chemical liquid for washing used was the same type as the chemical liquids to be measured, and those previously confirmed to have 3 or less defects by measurement using a surface inspection device (SP-5; made by KLA Tencor) were used.

The evaluation of the amount of change in the resonance frequency of the crystal oscillator was carried out by preparing a crystal oscillator sensor in which the adsorption layer shown in FIG. 5 is an Si layer and bringing each of the chemical liquids 1 to 44 into contact with the crystal oscillator sensor by using the measuring device (refer to FIG. 4) having the flow cell unit 12, shown in FIG. 7, having the crystal oscillator sensor. Specifically, the temperature of the chemical liquid was adjusted by a temperature adjustment unit such that the temperature of the chemical liquid is stable and 23° C. (±0.1° C.), and the amount of change (Hz) in the resonance frequency of the crystal oscillator in a case where each chemical liquid was circulated in the flow cell unit at a circulation flow rate of 20 ml/s for 60 minutes was obtained. In addition, the resonance frequency of the crystal oscillator before being brought into contact with the chemical liquid was 27 MHz.

In addition, in the measuring device used, at least a part of the liquid contact portion was made of the fluorine-based resin.

Specifically, the liquid contact portion (the portion coming into contact with the target chemical liquid) of the block 40, shown in FIG. 7, of the flow cell unit is made of a perfluoroethylene propene copolymer (FEP, Tensile strength: 20 to 30 MPa, Shore D hardness: 60 to 65, Bending modulus: 0.55 to 0.67 GPa). In addition, the liquid contact portion (the portion coming into contact with the target chemical liquid) of the liquid feeding unit is made of a THV soft fluororesin.

Additionally, the liquid contact portion (the portion coming into contact with the target chemical liquid) of the seal portion 42, shown in FIG. 7, which holds the target chemical liquid in the region, is made of polyvinylidene fluoride (PVDF, tensile strength: 30 to 70 MPa, Shore D hardness: 64 to 79).

Furthermore, the liquid contact portion (the portion coming into contact with the target chemical liquid) of the seal portion 42, shown in FIG. 7, which holds the target chemical liquid in the region, is made of perfluoroalkoxy alkane (PFA, tensile strength: 25 to 35 MPa, Shore D hardness: 62 to 66).

Additionally, in a case where the amount of change in the resonance frequency was measured, the amount of impurities eluted from the measuring device into the target chemical liquid was measured using LC/MS (Thermo LC/MS QE plus).

Example 2

Example 2 was conducted in the same manner as Example 1 except that the oscillator was not washed using a chemical liquid for washing.

Example 3

Example 3 was conducted in the same manner as Example 1 except that the chemical liquid was 3 times concentrated.

In Example 3, the chemical liquid was heated, vaporized, and 3 times concentrated.

Example 4

Example 4 was conducted in the same manner as Example 1 except that the temperature was not adjusted.

Example 5

Example 5 was conducted in the same manner as Example 1 except that the change in the frequency of the oscillator was measured in a state in which the oscillator was immersed without circulation of the chemical liquid (circulation flow rate: 0 mL/s)

[Evaluation Using Surface Inspection Device (1)]

First, a silicon wafer having a diameter of about 300 mm (12 inches) was prepared.

Next, a surface inspection device (SP-5; made by KLA Tencor) was used to measure the number of defects present on the silicon wafer (this is defined as an initial value).

Next, by using the "CLEAN TRACK LITHIUS (product name)" made by Tokyo Electron Limited, each of the chemical liquids 1 to 44 was rotationally applied onto the silicon wafer at 1,500 revolutions per minute (rpm), and thereafter, the silicon wafer was spin-dried.

Next, the number of defects present on the silicon wafer after the application of the chemical liquid was measured (this is defined as a measurement value) by using the surface inspection device (SP-5). Next, the difference between the initial value and the measurement value (measurement value−initial value) was calculated and defined as the number of defects. The number of defects represents the amount of impurities in the chemical liquid remaining on the silicon wafer, and means that the smaller the numerical value, the smaller the amount of impurities in the chemical liquid. The results are collectively shown in Tables 1 and 2.

In addition, the evaluation was performed in a clean room that satisfies the cleanliness of Class 2 or higher defined by the International Standard ISO 14644-1: 2015 established by the International Organization for Standardization.

In Tables 1 and 2, the "Chemical Liquid" column represents a chemical liquid used in each example. For example, the amounts of impurities differ between the chemical liquids 1 to 20 containing butyl acetate (nBA). The symbols of the chemical liquids in Tables 1 and 2 represent the following chemical liquids.

nBA: butyl acetate
MIBC: 4-methyl-2-pentanol
PGMEA: propylene glycol monomethyl ether acetate
IPA: isopropanol
CHN: cyclohexanone

TABLE 1

| | Type of Chemical Liquid | Example 1 Previously Washed Determination Coefficient ($R^2$) 0.992 Amount of Change in Resonance Frequency of Oscillator (Hz) | Example 2 No Previous Washing Determination Coefficient ($R^2$) 0.985 Amount of Change in Resonance Frequency of Oscillator (Hz) | Example 3 Concentrated Determination Coefficient ($R^2$) 0.99 Amount of Change in Resonance Frequency of Oscillator (Hz) | Example 4 No Temperature Control Determination Coefficient ($R^2$) 0.980 Amount of Change in Resonance Frequency of Oscillator (Hz) | Example 5 No Circulation Determination Coefficient ($R^2$) 0.968 Amount of Change in Resonance Frequency of Oscillator (Hz) | Surface Inspection Device Evaluation (number of defects/ wafer) (wafer surface: Si) |
|---|---|---|---|---|---|---|---|
| Chemical Liquid 1 | nBA | 994 | 1171 | 2830 | 513 | 375 | 10 |
| Chemical Liquid 2 | | 1019 | 1178 | 3114 | 794 | 384 | 10 |
| Chemical Liquid 3 | | 636 | 894 | 1818 | 769 | 149 | 8 |
| Chemical Liquid 4 | | 1811 | 2218 | 5497 | 1718 | 599 | 23 |
| Chemical Liquid 5 | | 5152 | 5993 | 15409 | 6888 | 1814 | 86 |
| Chemical Liquid 6 | | 2646 | 1995 | 7872 | 2980 | 1155 | 44 |
| Chemical Liquid 7 | | 9810 | 9335 | 29135 | 7480 | 4122 | 156 |

TABLE 1-continued

| | Type of Chemical Liquid | Example 1 Previously Washed Determination Coefficient ($R^2$) 0.992 Amount of Change in Resonance Frequency of Oscillator (Hz) | Example 2 No Previous Washing Determination Coefficient ($R^2$) 0.985 Amount of Change in Resonance Frequency of Oscillator (Hz) | Example 3 Concen-trated Determination Coefficient ($R^2$) 0.99 Amount of Change in Resonance Frequency of Oscillator (Hz) | Example 4 No Temperature Control Determination Coefficient ($R^2$) 0.980 Amount of Change in Resonance Frequency of Oscillator (Hz) | Example 5 No Circulation Determination Coefficient ($R^2$) 0.968 Amount of Change in Resonance Frequency of Oscillator (Hz) | Surface Inspection Device Evaluation (number of defects/wafer) (wafer surface: Si) |
|---|---|---|---|---|---|---|---|
| Chemical Liquid 8 | | 1159 | 1199 | 3474 | 976 | 492 | 14 |
| Chemical Liquid 9 | | 223 | 395 | 813 | 142 | 83 | 4 |
| Chemical Liquid 10 | | 5900 | 5943 | 17517 | 5598 | 1352 | 40 |
| Chemical Liquid 11 | | 1593 | 1418 | 4794 | 1692 | 507 | 19 |
| Chemical Liquid 12 | | 427 | 602 | 1262 | 431 | 194 | 5 |
| Chemical Liquid 13 | | 846 | 869 | 2385 | 988 | 276 | 10 |
| Chemical Liquid 14 | | 502 | 701 | 1602 | 515 | 142 | 6 |
| Chemical Liquid 15 | | 1258 | 1333 | 3642 | 969 | 386 | 13 |
| Chemical Liquid 16 | | 805 | 866 | 2487 | 1091 | 188 | 8 |
| Chemical Liquid 17 | | 1431 | 1574 | 4376 | 1749 | 433 | 18 |
| Chemical Liquid 18 | | 1157 | 1193 | 3575 | 1650 | 349 | 14 |
| Chemical Liquid 19 | | 411 | 621 | 1300 | 393 | 106 | 5 |
| Chemical Liquid 20 | | 487 | 533 | 1343 | 487 | 164 | 5 |

TABLE 2

| | Type of Chemical Liquid | Example 1 Previously Washed Determination Coefficient ($R^2$) 0.992 Amount of Change in Resonance Frequency of Oscillator (Hz) | Example 2 No Previous Washing Determination Coefficient ($R^2$) 0.985 Amount of Change in Resonance Frequency of Oscillator (Hz) | Example 3 Concen-trated Determination Coefficient ($R^2$) 0.99 Amount of Change in Resonance Frequency of Oscillator (Hz) | Example 4 No Temperature Control Determination Coefficient ($R^2$) 0.980 Amount of Change in Resonance Frequency of Oscillator (Hz) | Example 5 No Circulation Determination Coefficient ($R^2$) 0.968 Amount of Change in Resonance Frequency of Oscillator (Hz) | Surface Inspection Device Evaluation (number of defects/wafer) (wafer surface: Si) |
|---|---|---|---|---|---|---|---|
| Chemical Liquid 21 | MIBC | 331 | 378 | 1053 | 401 | 88 | 4 |
| Chemical Liquid 22 | | 51868 | 50974 | 153635 | 53144 | 23419 | 1025 |
| Chemical Liquid 23 | | 5361 | 6153 | 15945 | 4079 | 2723 | 63 |
| Chemical Liquid 24 | | 5678 | 6260 | 16760 | 6207 | 2593 | 67 |
| Chemical Liquid 25 | | 1177 | 1591 | 3585 | 707 | 564 | 13 |
| Chemical Liquid 26 | | 595 | 455 | 1764 | 439 | 160 | 7 |
| Chemical Liquid 27 | | 326 | 387 | 1093 | 249 | 145 | 6 |
| Chemical Liquid 28 | PGMEA | 4387 | 7848 | 12943 | 4169 | 2193 | 78 |
| Chemical Liquid 29 | | 374 | 449 | 1041 | 458 | 113 | 5 |
| Chemical Liquid 30 | | 643 | 641 | 1951 | 518 | 141 | 8 |
| Chemical Liquid 31 | | 1479 | 1696 | 4473 | 1624 | 355 | 18 |
| Chemical Liquid 32 | | 905 | 844 | 2768 | 514 | 217 | 11 |

TABLE 2-continued

| | Type of Chemical Liquid | Example 1 Previously Washed Determination Coefficient ($R^2$) 0.992 Amount of Change in Resonance Frequency of Oscillator (Hz) | Example 2 No Previous Washing Determination Coefficient ($R^2$) 0.985 Amount of Change in Resonance Frequency of Oscillator (Hz) | Example 3 Concen-trated Determination Coefficient ($R^2$) 0.99 Amount of Change in Resonance Frequency of Oscillator (Hz) | Example 4 No Temperature Control Determination Coefficient ($R^2$) 0.980 Amount of Change in Resonance Frequency of Oscillator (Hz) | Example 5 No Circulation Determination Coefficient ($R^2$) 0.968 Amount of Change in Resonance Frequency of Oscillator (Hz) | Surface Inspection Device Evaluation (number of defects/wafer) (wafer surface: Si) |
|---|---|---|---|---|---|---|---|
| Chemical Liquid 33 | IPA | 1071 | 1414 | 3238 | 1372 | 332 | 10 |
| Chemical Liquid 34 | | 641 | 714 | 1928 | 607 | 173 | 5 |
| Chemical Liquid 35 | | 326 | 385 | 1026 | 347 | 163 | 4 |
| Chemical Liquid 36 | | 19371 | 19992 | 57466 | 24820 | 4354 | 358 |
| Chemical Liquid 37 | | 167 | 110 | 563 | 157 | 41 | 2 |
| Chemical Liquid 38 | CHN | 582 | 848 | 1642 | 386 | 253 | 6 |
| Chemical Liquid 39 | | 426 | 804 | 1144 | 589 | 206 | 5 |
| Chemical Liquid 40 | | 10897 | 10897 | 32357 | 12559 | 4814 | 172 |
| Chemical Liquid 41 | | 619 | 705 | 1828 | 405 | 136 | 8 |
| Chemical Liquid 42 | | 290 | 426 | 1010 | 395 | 111 | 3 |
| Chemical Liquid 43 | | 8442 | 8631 | 25006 | 10926 | 2819 | 145 |
| Chemical Liquid 44 | | 496 | 676 | 1497 | 534 | 107 | 6 |

Points for the amounts of change (resonance frequency change amount (Hz) of the oscillator) in the resonance frequency of all the chemical liquids and the number of defects (surface inspection device evaluation (number of defects/wafer)) in Examples 1 to 5 were plotted, and a calibration curve passing through the plotted points was created by the least square method to calculate determination coefficients ($R^2$). The determination coefficient was calculated as 0.992 in Example 1, 0.985 in Example 2, 0.99 in Example 3, 0.980 in Example 4, and 0.968 in Example 5 as shown in Table 1. The closer the determination coefficient is to 1.000, the better the results, but the results in Tables 1 and 2 show that the correlation between the amount of change in the resonance frequency and the number of defects is high.

As described above, as shown in Tables 1 and 2, there is a correlation between the amount of change in the resonance frequency and the number of defects, and in a case where the amount of change in the resonance frequency is large, the number of defects tends to increase.

In addition, from Examples 1 and 2, the determination coefficient was increased by washing the oscillator before measurement of the amount of change in the resonance frequency, and it was effective to wash the oscillator before measurement.

In addition, from Examples 1 and 3, the signal intensity of change in the resonance frequency was increased about three-fold by 3 times concentrating the chemical liquid. Therefore, it was possible to measure the resonance frequency with higher sensitivity. In Example 3, the determination coefficient $R^2$ was 0.99 and had a high correlation with the number of defects.

In Example 4, the temperature was not adjusted, and as a result, the temperature during the measurement fluctuated in a range of 23° C.±3° C. From Examples 1 and 4, since the determination coefficient was high in Example 1, the effectiveness of temperature control was shown. In addition, the value of the amount of change in the resonance frequency is presumed to be influenced by the fact that the attachment coefficient of the impurities in the chemical liquid to the oscillator differs depending on the temperature and the fact that organic impurities are generated due to the change in the temperature.

From Examples 1 and 5, since the determination coefficient was high in Example 1, the effectiveness of circulation of the chemical liquid was shown. It was found that in a case where the chemical liquid is circulated, the foreign matter in the chemical liquid has more chances of contact with the oscillator and is easily adsorbed, and thus the change in the resonance frequency is more easily grasped and managed.

The lithography step shown below was performed by using the chemical liquids 1 to 44 of Example 1 as a pre-wet liquid, and as a result, it was possible to form a resist film having a resist pattern.

(Lithography Step)

First, a silicon wafer having a diameter of about 300 mm (12 inches) was pre-wet by using each chemical liquid. Next, a resist resin composition was rotationally applied onto the pre-wet silicon wafer. Thereafter, the wafer was heated and dried at a temperature of 150° C. for 90 seconds on a hot plate to form a resist film having a thickness of 90 nm.

Pattern exposure was performed on this resist film under exposure conditions of NA=1.20, Dipole (oσ/iσ)=0.981/0.859, and Y-polarized light using an ArF excimer laser scanner (made by ASML, XT: 1,700 i, wavelength: 193 nm) via a mask having a line and space pattern such that a line width of a pattern formed after reduced projection exposure and development was 45 nm, and a space width was 45 nm. After irradiation, the resist film was baked at a temperature of 120° C. for 60 seconds. Then, the resist film was developed, rinsed, and then baked at a temperature of 110° C. for 60 seconds, and thus it was possible to form a resist pattern having a line width of 45 nm and a space width of 45 nm.

The following materials were used for the resist resin composition.

(Resist Resin Composition)

The resist resin composition will be described. The resist resin composition was obtained by mixing together the following components.

Acid-decomposable resin (resin represented by the following formula (weight-average molecular weight (Mw) 7,500): the numerical value described in each repeating unit means mol %): 100 parts by mass

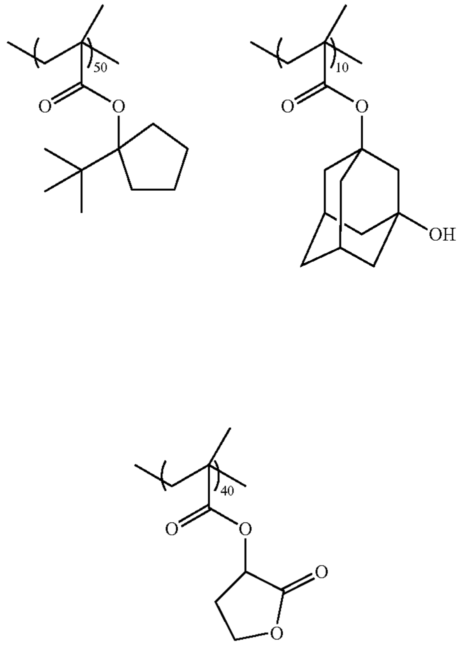

The following photoacid generator: 8 parts by mass

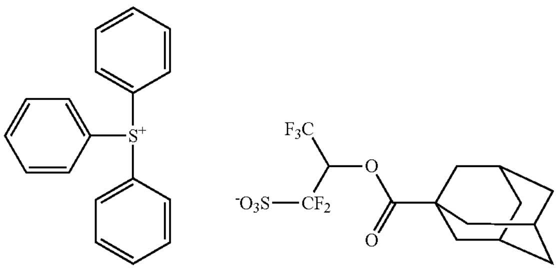

The following quencher: 5 parts by mass (the mass ratio was 0.1:0.3:0.3:0.2 in this order from the left). Among the following quenchers, a polymer type quencher has a weight-average molecular weight (Mw) of 5,000. The numerical value described in each repeating unit means molar ratio.

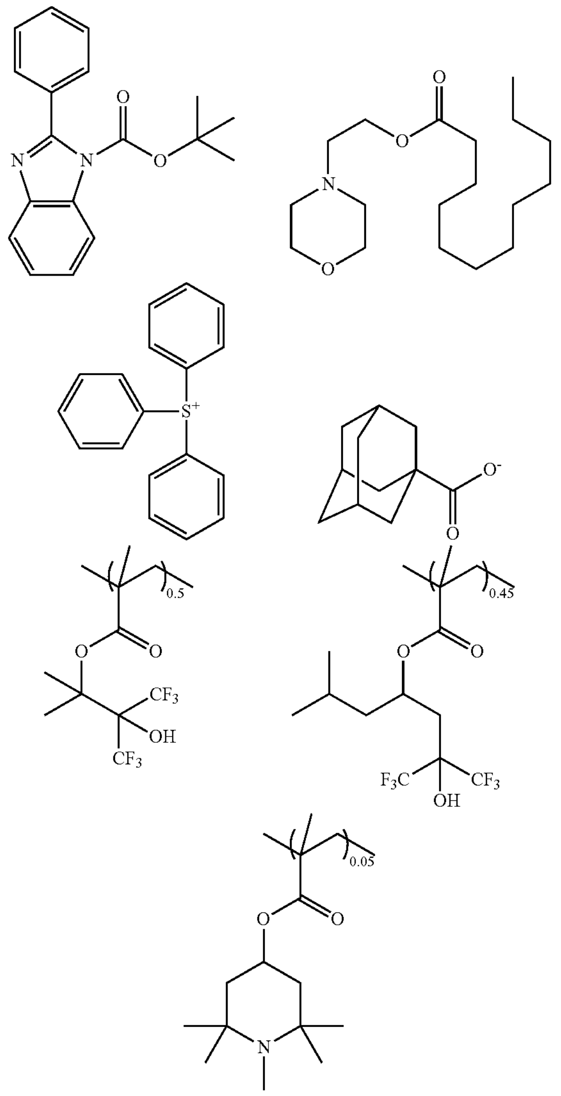

The following hydrophobic resin: 4 parts by mass (the mass ratio was (1):(2)=0.5:0.5).

Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

(1)

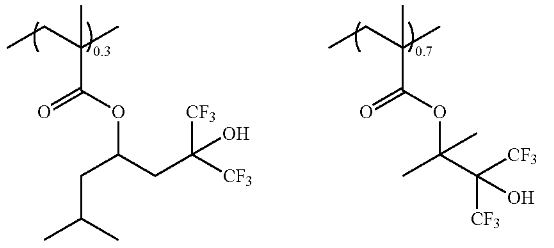

-continued (2)

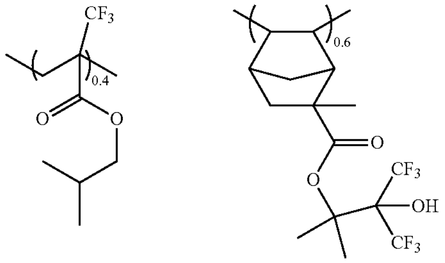

Solvent:

Propylene Glycol Monomethylether Acetate (PGMEA): 3 parts by mass

Cyclohexanone: 600 parts by mass

γ-Butyrolactone (γ-BL): 100 parts by mass

Example B

The chemical liquid 1 of Example A described above was used as a washing solution for an application and developing apparatus. The amount of change in the resonance frequency of the washing solution after washing was measured. As an oscillator, the oscillator of Example 1 was used, and the amount of change in the resonance frequency was measured in the same manner as in Example 1 described above. Hereinafter, the method of measuring the cleanliness of the washing solution will be described.

(Method of Measuring Cleanliness of Washing Solution)

An application and developing apparatus contaminated with foreign matter or the like was used. To determine the degree of contamination of the contaminated application and developing apparatus, the chemical liquid 1 was fed before washing, and the discharged chemical solution 1 was examined. As a result, it was confirmed that 1,000 or more defects were generated on the silicon wafer having a diameter of about 300 mm (12 inches).

The number of defects is a value obtained by measuring the number of defects present on each substrate by using a surface inspection device (SP-5; made by KLA Tencor).

A total of 2 gallons of the chemical liquid 1 was fed to the application and developing apparatus to subject the application and developing apparatus to flushing washing. In the flushing washing, the chemical liquid used for washing and discharged from the application and developing apparatus was collected every 0.2 gallons. Post-washing surface inspection device defect evaluation was performed on the collected chemical liquid by using a surface inspection device (SP-5; made by KLA Tencor), and the amount of change in the resonance frequency was measured.

Regarding the flushing washing using 2 gallons of the chemical liquid 1, the results of the post-washing surface inspection device defect evaluation and the amount of change in the resonance frequency obtained are as shown in Table 3 below.

TABLE 3

| Amount of Chemical Liquid 1 Fed (gallon) | Post-Washing Surface Inspection Device Defect Evaluation (number of defects/wafer) | Amount of Change in Resonance Frequency of Oscillator (Hz) |
|---|---|---|
| 0.0 | 3522 | 182111 |
| 0.2 | 1768 | 90872 |
| 0.4 | 1015 | 51987 |
| 0.6 | 475 | 25102 |
| 0.8 | 208 | 11301 |
| 1.0 | 101 | 5901 |
| 1.2 | 58 | 3530 |
| 1.4 | 41 | 2703 |
| 1.6 | 28 | 2101 |
| 1.8 | 29 | 2113 |
| 2.0 | 27 | 1950 |

As shown in Table 3, it was found that the amount of defects remaining on the silicon wafer is reduced with an increase in the amount of the liquid fed. In addition, since the number of defects after washing, which is shown by the post-washing surface inspection device defect evaluation, also correlated with the amount of change in the resonance frequency, it was found that the amount of defects generated, that is, the degree of contamination of the semiconductor manufacturing apparatus can be grasped by measuring the amount of change in the resonance frequency without evaluation using the surface inspection device.

Example C

[Evaluation Using Crystal Oscillator Sensor (2)]

The amount of change in the resonance frequency was measured according to the same procedure as in [Evaluation Using Crystal Oscillator Sensor (1)] except that a crystal oscillator sensor in which the adsorption layer 34 shown in FIG. 5 was each of a $SiO_2$ layer, a SiOC layer, a Cu layer, a Co layer, a Ti layer, a W layer, a TiN layer, a Ta layer, and a TaN layer was prepared. In addition, the resonance frequency of the crystal oscillator of each layer before being brought into contact with the chemical liquid was 27 MHz. The results are collectively shown in Tables 4 to 21.

In addition, the evaluation was performed in a clean room that satisfies the cleanliness of Class 2 or higher defined by the International Standard ISO 14644-1: 2015 established by the International Organization for Standardization.

[Evaluation Using Surface Inspection Device (2)]

First, various substrates ($SiO_2$ substrate, SiOC substrate, Cu substrate, Co substrate, Ti substrate, W substrate, TiN substrate, Ta substrate, and TaN substrate) were prepared.

Next, a surface inspection device (SP-5; made by KLA Tencor) was used to measure the number of defects present on each substrate (this is defined as an initial value).

Next, by using the "CLEAN TRACK LITHIUS (product name)" made by Tokyo Electron Limited, each of the chemical liquids 1 to 44 was rotationally applied onto the substrate at 1,500 rpm, and thereafter, the substrate was spin-dried.

Next, the number of defects present on the substrate after the application of the chemical liquid was measured (this is defined as a measurement value) by using the surface inspection device (SP-5). Next, the difference between the initial value and the measurement value (measurement value−initial value) was calculated and defined as the number of defects. The results are collectively shown in Tables 4 to 21.

In addition, the evaluation was performed in a clean room that satisfies the cleanliness of Class 2 or higher defined by the International Standard ISO 14644-1: 2015 established by the International Organization for Standardization.

In Tables 4 to 21, the results using adsorption layers and substrates of the same metal types are shown side by side. For example, in the "$SiO_2$" column in Table 3, the results of [Evaluation Using Crystal Oscillator Sensor (2)] using a "$SiO_2$ layer" as an adsorption layer and the results of [Evaluation Using Surface Inspection Device (2)] using a $SiO_2$ substrate are shown.

TABLE 4

| | Type of Chemical Liquid | Amount of Change in Resonance Frequency of Oscillator (Hz) ($SiO_2$ adsorption layer) | Surface Inspection Device Evaluation (number of defects/wafer) (wafer surface: $SiO_2$) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 229 | 25 | 40 | 27 |
| Chemical Liquid 2 | | 235 | 25 | 31 | 37 |
| Chemical Liquid 3 | | 147 | 20 | 51 | 26 |
| Chemical Liquid 4 | | 418 | 57 | 119 | 54 |
| Chemical Liquid 5 | | 1189 | 215 | 105 | 85 |
| Chemical Liquid 6 | | 611 | 110 | 139 | 61 |
| Chemical Liquid 7 | | 2264 | 390 | 265 | 237 |
| Chemical Liquid 8 | | 268 | 36 | 121 | 44 |
| Chemical Liquid 9 | | 51 | 11 | 54 | 21 |
| Chemical Liquid 10 | | 1362 | 100 | 137 | 62 |
| Chemical Liquid 11 | | 368 | 48 | 32 | 46 |
| Chemical Liquid 12 | | 99 | 13 | 114 | 12 |
| Chemical Liquid 13 | | 195 | 26 | 126 | 12 |
| Chemical Liquid 14 | | 116 | 16 | 30 | 11 |
| Chemical Liquid 15 | | 290 | 31 | 65 | 50 |
| Chemical Liquid 16 | | 186 | 20 | 71 | 26 |
| Chemical Liquid 17 | | 330 | 45 | 48 | 18 |
| Chemical Liquid 18 | | 267 | 36 | 96 | 37 |
| Chemical Liquid 19 | | 95 | 11 | 100 | 10 |
| Chemical Liquid 20 | | 112 | 14 | 131 | 4 |

TABLE 5

| | Type of Chemical Liquid | Amount of Change in Resonance Frequency of Oscillater (Hz) ($SiO_2$ adsorption layer) | Surface Inspection Device Evaluation (number of defects/wafer) (wafer surface: $SiO_2$) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 76 | 10 | 50 | 19 |
| Chemical Liquid 22 | | 11969 | 2563 | 1092 | 1019 |
| Chemical Liquid 23 | | 1237 | 158 | 146 | 91 |
| Chemical Liquid 24 | | 1310 | 167 | 160 | 71 |
| Chemical Liquid 25 | | 272 | 33 | 70 | 23 |
| Chemical Liquid 26 | | 137 | 17 | 59 | 28 |
| Chemical Liquid 27 | | 75 | 14 | 75 | 42 |
| Chemical Liquid 25 | PGMEA | 1012 | 195 | 101 | 91 |
| Chemical Liquid 29 | | 86 | 12 | 80 | 6 |
| Chemical Liquid 30 | | 148 | 21 | 24 | 24 |
| Chemical Liquid 31 | | 341 | 45 | 134 | 25 |
| Chemical Liquid 32 | | 209 | 27 | 78 | 45 |
| Chemical Liquid 33 | IPA | 247 | 24 | 82 | 23 |
| Chemical Liquid 34 | | 148 | 13 | 26 | 21 |
| Chemical Liquid 35 | | 75 | 11 | 82 | 13 |
| Chemical Liquid 36 | | 4470 | 895 | 448 | 417 |
| Chemical Liquid 37 | | 38 | 6 | 41 | 9 |
| Chemical Liquid 38 | CHN | 134 | 16 | 85 | 19 |
| Chemical Liquid 39 | | 98 | 13 | 109 | 20 |
| Chemical Liquid 40 | | 2515 | 430 | 291 | 98 |
| Chemical Liquid 41 | | 143 | 19 | 79 | 10 |

TABLE 5-continued

| | Type of Chemical Liquid | Amount of Change in Resonance Frequency of Oscillater (Hz) ($SiO_2$ adsorption layer) | Surface Inspection Device Evaluation (number of defects/wafer) (wafer surface: $SiO_2$) | Pattern Defect Evaluation (number of defects/wafer) | Post-Washing Surface Inspection Device Defect Evaluation (number of defects/wafer) |
|---|---|---|---|---|---|
| Chemical Liquid 42 | | 67 | 8 | 83 | 33 |
| Chemical Liquid 43 | | 1948 | 363 | 206 | 148 |
| Chemical Liquid 44 | | 110 | 15 | 136 | 22 |

TABLE 6

| | Type of Chemical Liquid | Amount of Change in Resonance Frequency of Oscillator (Hz) (SiOC adsorption layer) | Surface Inspection Device Evaluation (number of defects/wafer) (wafer surface: SiOC) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 552 | 72 | 40 | 27 |
| Chemical Liquid 2 | | 566 | 74 | 31 | 37 |
| Chemical Liquid 3 | | 353 | 58 | 51 | 26 |
| Chemical Liquid 4 | | 1006 | 164 | 119 | 54 |
| Chemical Liquid 5 | | 2862 | 623 | 105 | 85 |
| Chemical Liquid 6 | | 1470 | 320 | 139 | 61 |
| Chemical Liquid 7 | | 5450 | 1131 | 265 | 237 |
| Chemical Liquid 8 | | 644 | 105 | 121 | 44 |
| Chemical Liquid 9 | | 124 | 32 | 54 | 21 |
| Chemical Liquid 10 | | 3278 | 290 | 137 | 62 |
| Chemical Liquid 11 | | 885 | 139 | 32 | 46 |
| Chemical Liquid 12 | | 237 | 37 | 114 | 12 |
| Chemical Liquid 13 | | 470 | 76 | 126 | 12 |
| Chemical Liquid 14 | | 279 | 45 | 30 | 11 |
| Chemical Liquid 15 | | 699 | 91 | 65 | 50 |
| Chemical Liquid 16 | | 447 | 58 | 51 | 26 |
| Chemical Liquid 17 | | 795 | 130 | 48 | 18 |
| Chemical Liquid 18 | | 643 | 105 | 96 | 37 |
| Chemical Liquid 19 | | 228 | 33 | 100 | 10 |
| Chemical Liquid 20 | | 270 | 39 | 131 | 4 |

TABLE 7

| | Type of Chemical Liquid | Amount of Change in Resonance Frequency of Oscillator (Hz) (SiOC adsorption layer) | Surface Inspection Device Evaluation (number of defects/wafer) (wafer surface: SiOC) | Pattern Defect Evaluation (number of defects/water) | Post-Washing Surface Inspection Device Defect Evaluation (number of defects/wafer) |
|---|---|---|---|---|---|
| Chemical Liquid 21 | MIBC | 184 | 29 | 50 | 19 |
| Chemical Liquid 22 | | 28815 | 7431 | 1092 | 1019 |
| Chemical Liquid 23 | | 2978 | 457 | 146 | 91 |
| Chemical Liquid 24 | | 3154 | 484 | 160 | 71 |
| Chemical Liquid 25 | | 654 | 95 | 70 | 23 |
| Chemical Liquid 26 | | 331 | 48 | 59 | 28 |
| Chemical Liquid 27 | | 181 | 42 | 75 | 42 |
| Chemical Liquid 28 | PGMEA | 2437 | 565 | 101 | 91 |
| Chemical Liquid 29 | | 208 | 35 | 80 | 6 |
| Chemical Liquid 30 | | 357 | 60 | 24 | 24 |
| Chemical Liquid 31 | | 821 | 129 | 134 | 25 |
| Chemical Liquid 33 | | 503 | 79 | 78 | 45 |

TABLE 7-continued

| | Type of Chemical Liquid | Amount of Change in Resonance Frequency of Oscillator (Hz) (SiOC adsorption layer) | Surface Inspection Device Evaluation (number of defects/wafer) (wafer surface: SiOC) | Pattern Defect Evaluation (number of defects/water) | Post-Washing Surface Inspection Device Defect Evaluation (number of defects/wafer) |
|---|---|---|---|---|---|
| Chemical Liquid 33 | IPA | 595 | 71 | 82 | 23 |
| Chemical Liquid 34 | | 356 | 39 | 26 | 21 |
| Chemical Liquid 35 | | 181 | 32 | 82 | 13 |
| Chemical Liquid 36 | | 10761 | 2596 | 448 | 417 |
| Chemical Liquid 37 | | 93 | 17 | 41 | 9 |
| Chemical Liquid 38 | CHN | 323 | 47 | 85 | 19 |
| Chemical Liquid 39 | | 237 | 37 | 109 | 20 |
| Chemical Liquid 40 | | 6054 | 1247 | 291 | 98 |
| Chemical Liquid 41 | | 344 | 56 | 79 | 10 |
| Chemical Liquid 42 | | 161 | 23 | 83 | 33 |
| Chemical Liquid 43 | | 4690 | 1051 | 206 | 148 |
| Chemical Liquid 44 | | 264 | 44 | 136 | 22 |

TABLE 8

| | Type of Chemical Liquid | Amount of Change in Resonance Frequency of Oscillator (Hz) (Cu adsorption layer) | Surface Inspection Device Evaluation (number of defects/wafer) (wafer surface: Cu) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 248 | 216 | 40 | 27 |
| Chemical Liquid 2 | | 255 | 222 | 31 | 37 |
| Chemical Liquid 3 | | 159 | 173 | 51 | 26 |
| Chemical Liquid 4 | | 453 | 492 | 119 | 54 |
| Chemical Liquid 5 | | 1288 | 1868 | 105 | 85 |
| Chemical Liquid 6 | | 661 | 959 | 139 | 61 |
| Chemical Liquid 7 | | 2453 | 3393 | 265 | 237 |
| Chemical Liquid 8 | | 290 | 315 | 121 | 44 |
| Chemical Liquid 9 | | 56 | 97 | 54 | 21 |
| Chemical Liquid 10 | | 1475 | 870 | 137 | 62 |
| Chemical Liquid 11 | | 398 | 417 | 32 | 46 |
| Chemical Liquid 12 | | 107 | 112 | 114 | 12 |
| Chemical Liquid 13 | | 212 | 227 | 126 | 12 |
| Chemical Liquid 14 | | 126 | 135 | 30 | 11 |
| Chemical Liquid 15 | | 314 | 274 | 65 | 50 |
| Chemical Liquid 16 | | 201 | 175 | 71 | 26 |
| Chemical Liquid 17 | | 358 | 389 | 48 | 18 |
| Chemical Liquid 18 | | 289 | 315 | 96 | 37 |
| Chemical Liquid 19 | | 103 | 99 | 100 | 10 |
| Chemical Liquid 20 | | 122 | 118 | 131 | 4 |

TABLE 9

| | Type of Chemical Liquid | Amount of Change in Resonance Frequency of Oscillator (Hz) (Cu adsorption layer) | Surface Inspection Device Evaluation (number of defects/wafer) (wafer surface: Cu) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 83 | 87 | 50 | 19 |
| Chemical Liquid 22 | | 12967 | 22294 | 1092 | 1019 |
| Chemical Liquid 23 | | 1340 | 1372 | 146 | 91 |

TABLE 9-continued

| | Type of Chemical Liquid | Amount of Change in Resonance Frequency of Oscillator (Hz) (Cu adsorption layer) | Surface Inspection Device Evaluation (number of defects/wafer) (wafer surface: Cu) | Pattern Defect Evaluation (number of defects/wafer) | Post-Washing Surface Inspection Device Defect Evaluation (number of defects/wafer) |
|---|---|---|---|---|---|
| Chemical Liquid 24 | | 1419 | 1453 | 160 | 71 |
| Chemical Liquid 25 | | 294 | 285 | 70 | 23 |
| Chemical Liquid 26 | | 149 | 144 | 59 | 28 |
| Chemical Liquid 27 | | 82 | 126 | 75 | 42 |
| Chemical Liquid 28 | PGMEA | 1097 | 1696 | 101 | 91 |
| Chemical Liquid 29 | | 94 | 105 | 80 | 6 |
| Chemical Liquid 30 | | 161 | 180 | 24 | 24 |
| Chemical Liquid 31 | | 370 | 387 | 134 | 25 |
| Chemical Liquid 32 | | 226 | 237 | 78 | 45 |
| Chemical Liquid 33 | IPA | 268 | 212 | 82 | 23 |
| Chemical Liquid 34 | | 160 | 117 | 26 | 21 |
| Chemical Liquid 35 | | 82 | 95 | 82 | 13 |
| Chemical Liquid 36 | | 4843 | 7787 | 448 | 417 |
| Chemical Liquid 37 | | 42 | 52 | 41 | 9 |
| Chemical Liquid 38 | CHN | 145 | 141 | 85 | 19 |
| Chemical Liquid 39 | | 106 | 112 | 109 | 20 |
| Chemical Liquid 40 | | 2724 | 3741 | 291 | 98 |
| Chemical Liquid 41 | | 155 | 168 | 79 | 10 |
| Chemical Liquid 42 | | 72 | 70 | 83 | 33 |
| Chemical Liquid 43 | | 2110 | 3154 | 206 | 148 |
| Chemical Liquid 44 | | 119 | 131 | 136 | 22 |

TABLE 10

| | Type of Chemical Liquid | Amount of Change in Resonance Frequency of Oscillator (Hz) (Co adsorp-tion layer) | Surface Inspection Device Evaluation (number of defects/wafer) (wafer surface: Co) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 284 | 205 | 40 | 27 |
| Chemical Liquid 2 | | 291 | 211 | 31 | 37 |
| Chemical Liquid 3 | | 182 | 164 | 51 | 26 |
| Chemical Liquid 4 | | 518 | 468 | 119 | 54 |
| Chemical Liquid 5 | | 1472 | 1774 | 105 | 85 |
| Chemical Liquid 6 | | 756 | 911 | 139 | 61 |
| Chemical Liquid 7 | | 2803 | 3223 | 265 | 237 |
| Chemical Liquid 8 | | 331 | 299 | 121 | 44 |
| Chemical Liquid 9 | | 64 | 92 | 54 | 21 |
| Chemical Liquid 10 | | 1686 | 827 | 137 | 62 |
| Chemical Liquid 11 | | 455 | 397 | 32 | 46 |
| Chemical Liquid 12 | | 122 | 106 | 114 | 12 |
| Chemical Liquid 13 | | 242 | 216 | 126 | 12 |
| Chemical Liquid 14 | | 144 | 128 | 30 | 11 |
| Chemical Liquid 15 | | 359 | 260 | 65 | 50 |
| Chemical Liquid 16 | | 230 | 166 | 71 | 26 |
| Chemical Liquid 17 | | 409 | 370 | 48 | 18 |
| Chemical Liquid 18 | | 331 | 299 | 96 | 37 |
| Chemical Liquid 19 | | 117 | 94 | 100 | 10 |
| Chemical Liquid 20 | | 139 | 112 | 131 | 4 |

TABLE 11

| | Type of Chemical Liquid | Amount of Change in Resonance Frequency of Oscillator (Hz) (Co adsorption layer) | Surface Inspection Device Evaluation (number of defects/wafer) (wafer surface: Co) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 95 | 82 | 50 | 19 |
| Chemical Liquid 22 | | 14819 | 21179 | 1092 | 1019 |
| Chemical Liquid 23 | | 1532 | 1303 | 146 | 91 |
| Chemical Liquid 24 | | 1622 | 1380 | 160 | 71 |
| Chemical Liquid 25 | | 336 | 270 | 70 | 23 |
| Chemical Liquid 26 | | 170 | 137 | 59 | 28 |
| Chemical Liquid 27 | | 93 | 120 | 75 | 42 |
| Chemical Liquid 28 | PGMEA | 1253 | 1612 | 101 | 91 |
| Chemical Liquid 29 | | 107 | 99 | 80 | 6 |
| Chemical Liquid 30 | | 184 | 171 | 24 | 24 |
| Chemical Liquid 31 | | 422 | 368 | 134 | 25 |
| Chemical Liquid 32 | | 258 | 225 | 78 | 45 |
| Chemical Liquid 33 | IPA | 306 | 201 | 82 | 23 |
| Chemical Liquid 34 | | 183 | 112 | 26 | 21 |
| Chemical Liquid 35 | | 93 | 90 | 82 | 13 |
| Chemical Liquid 36 | | 5534 | 7397 | 448 | 417 |
| Chemical Liquid 37 | | 48 | 49 | 41 | 9 |
| Chemical Liquid 38 | CHN | 166 | 134 | 85 | 19 |
| Chemical Liquid 39 | | 122 | 106 | 109 | 20 |
| Chemical Liquid 40 | | 3114 | 3554 | 291 | 98 |
| Chemical Liquid 41 | | 177 | 160 | 79 | 10 |
| Chemical Liquid 42 | | 83 | 67 | 83 | 33 |
| Chemical Liquid 43 | | 2412 | 2996 | 206 | 148 |
| Chemical Liquid 44 | | 136 | 125 | 136 | 22 |

TABLE 12

| | Type of Chemical Liquid | Amount of Change in Resonance Frequency of Oscillator (Hz) (Ti adsorption layer) | Surface Inspection Device Evaluation (number of defects/wafer) (wafer surface: Ti) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 248 | 400 | 40 | 27 |
| Chemical Liquid 2 | | 255 | 411 | 31 | 37 |
| Chemical Liquid 3 | | 159 | 320 | 51 | 26 |
| Chemical Liquid 4 | | 453 | 912 | 119 | 54 |
| Chemical Liquid 5 | | 1288 | 3460 | 105 | 85 |
| Chemical Liquid 6 | | 661 | 1777 | 139 | 61 |
| Chemical Liquid 7 | | 2453 | 6286 | 265 | 237 |
| Chemical Liquid 8 | | 290 | 584 | 121 | 44 |
| Chemical Liquid 9 | | 56 | 180 | 54 | 21 |
| Chemical Liquid 10 | | 1475 | 1612 | 137 | 62 |
| Chemical Liquid 11 | | 398 | 773 | 32 | 46 |
| Chemical Liquid 12 | | 107 | 207 | 114 | 12 |
| Chemical Liquid 13 | | 212 | 421 | 126 | 12 |
| Chemical Liquid 14 | | 126 | 250 | 30 | 11 |
| Chemical Liquid 15 | | 314 | 507 | 65 | 50 |
| Chemical Liquid 16 | | 201 | 324 | 71 | 26 |
| Chemical Liquid 17 | | 358 | 721 | 48 | 18 |
| Chemical Liquid 18 | | 289 | 583 | 96 | 37 |
| Chemical Liquid 19 | | 103 | 184 | 100 | 10 |
| Chemical Liquid 20 | | 122 | 218 | 131 | 4 |

TABLE 13

| | Type of Chemical Liquid | Amount of Change in Resonance Frequency of Oscillator (Hz) (Ti adsorption layer) | Surface Inspection Device Evaluation (number of defects/wafer) (wafer surface: Ti) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 83 | 161 | 50 | 19 |
| Chemical Liquid 22 | | 12967 | 41299 | 1092 | 1019 |
| Chemical Liquid 23 | | 1340 | 2541 | 146 | 91 |
| Chemical Liquid 24 | | 1419 | 2691 | 160 | 71 |
| Chemical Liquid 25 | | 294 | 527 | 70 | 23 |
| Chemical Liquid 26 | | 149 | 267 | 59 | 28 |
| Chemical Liquid 27 | | 82 | 234 | 75 | 42 |
| Chemical Liquid 28 | PGMEA | 1097 | 3142 | 101 | 91 |
| Chemical Liquid 29 | | 94 | 194 | 80 | 6 |
| Chemical Liquid 30 | | 161 | 333 | 24 | 24 |
| Chemical Liquid 31 | | 370 | 718 | 134 | 25 |
| Chemical Liquid 32 | | 226 | 439 | 78 | 45 |
| Chemical Liquid 33 | IPA | 268 | 392 | 82 | 23 |
| Chemical Liquid 34 | | 160 | 217 | 26 | 21 |
| Chemical Liquid 35 | | 82 | 175 | 82 | 13 |
| Chemical Liquid 36 | | 4843 | 14424 | 448 | 417 |
| Chemical Liquid 37 | | 42 | 96 | 41 | 9 |
| Chemical Liquid 38 | CHN | 145 | 260 | 85 | 19 |
| Chemical Liquid 39 | | 106 | 207 | 109 | 20 |
| Chemical Liquid 40 | | 2724 | 6930 | 291 | 98 |
| Chemical Liquid 41 | | 155 | 312 | 79 | 10 |
| Chemical Liquid 42 | | 72 | 130 | 83 | 33 |
| Chemical Liquid 43 | | 2110 | 5842 | 206 | 148 |
| Chemical Liquid 44 | | 119 | 244 | 136 | 22 |

TABLE 14

| | Type of Chemical Liquid | Amount of Change in Resonance Frequency of Oscillator (Hz) (W adsorption layer) | Surface Inspection Device Evaluation (number of defects/wafer) (wafer surface: W) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 259 | 601 | 40 | 27 |
| Chemical Liquid 2 | | 266 | 616 | 31 | 37 |
| Chemical Liquid 3 | | 166 | 481 | 51 | 26 |
| Chemical Liquid 4 | | 473 | 1368 | 119 | 54 |
| Chemical Liquid 5 | | 1344 | 5190 | 105 | 85 |
| Chemical Liquid 6 | | 690 | 2665 | 139 | 61 |
| Chemical Liquid 7 | | 2559 | 9428 | 265 | 237 |
| Chemical Liquid 8 | | 302 | 876 | 121 | 44 |
| Chemical Liquid 9 | | 58 | 270 | 54 | 21 |
| Chemical Liquid 10 | | 1539 | 2418 | 137 | 62 |
| Chemical Liquid 11 | | 416 | 1160 | 32 | 46 |
| Chemical Liquid 12 | | 111 | 311 | 114 | 12 |
| Chemical Liquid 13 | | 221 | 631 | 126 | 12 |
| Chemical Liquid 14 | | 131 | 375 | 30 | 11 |
| Chemical Liquid 15 | | 328 | 760 | 65 | 50 |
| Chemical Liquid 16 | | 210 | 487 | 71 | 26 |
| Chemical Liquid 17 | | 373 | 1081 | 48 | 18 |
| Chemical Liquid 18 | | 302 | 874 | 96 | 37 |
| Chemical Liquid 19 | | 107 | 276 | 100 | 10 |
| Chemical Liquid 20 | | 127 | 327 | 131 | 4 |

TABLE 15

| | Type of Chemical Liquid | Amount of Change in Resonance Frequency of Oscillator (Hz) (W adsorption layer) | Surface Inspection Device Evaluation (number of defects/wafer) (wafer surface: W) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 86 | 241 | 50 | 19 |
| Chemical Liquid 22 | | 13531 | 61949 | 1092 | 1019 |
| Chemical Liquid 23 | | 1399 | 3812 | 146 | 91 |
| Chemical Liquid 24 | | 1481 | 4037 | 160 | 71 |
| Chemical Liquid 25 | | 307 | 791 | 70 | 23 |
| Chemical Liquid 26 | | 155 | 400 | 59 | 28 |
| Chemical Liquid 27 | | 85 | 350 | 75 | 42 |
| Chemical Liquid 28 | PGMEA | 1144 | 4714 | 101 | 91 |
| Chemical Liquid 29 | | 98 | 291 | 80 | 6 |
| Chemical Liquid 30 | | 168 | 499 | 24 | 24 |
| Chemical Liquid 31 | | 386 | 1077 | 134 | 25 |
| Chemical Liquid 32 | | 236 | 659 | 78 | 45 |
| Chemical Liquid 33 | IPA | 279 | 588 | 82 | 23 |
| Chemical Liquid 34 | | 167 | 326 | 26 | 21 |
| Chemical Liquid 35 | | 85 | 263 | 82 | 13 |
| Chemical Liquid 36 | | 5053 | 21637 | 448 | 417 |
| Chemical Liquid 37 | | 43 | 144 | 41 | 9 |
| Chemical Liquid 38 | CHN | 152 | 391 | 85 | 19 |
| Chemical Liquid 39 | | 111 | 310 | 109 | 20 |
| Chemical Liquid 40 | | 2843 | 10395 | 291 | 98 |
| Chemical Liquid 41 | | 162 | 468 | 79 | 10 |
| Chemical Liquid 42 | | 76 | 195 | 83 | 33 |
| Chemical Liquid 43 | | 2202 | 8763 | 206 | 148 |
| Chemical Liquid 44 | | 124 | 365 | 136 | 22 |

TABLE 16

| | Type of Chemical Liquid | Amount of Change in Resonance Frequency of Oscillator (Hz) (TiN adsorption layer) | Surface Inspection Device Evaluation (number of defects/wafer) (wafer surface: TiN) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 346 | 481 | 40 | 27 |
| Chemical Liquid 2 | | 354 | 493 | 31 | 37 |
| Chemical Liquid 3 | | 221 | 384 | 51 | 26 |
| Chemical Liquid 4 | | 630 | 1095 | 119 | 54 |
| Chemical Liquid 5 | | 1792 | 4152 | 105 | 85 |
| Chemical Liquid 6 | | 920 | 2132 | 139 | 61 |
| Chemical Liquid 7 | | 3412 | 7543 | 265 | 237 |
| Chemical Liquid 8 | | 403 | 701 | 121 | 44 |
| Chemical Liquid 9 | | 78 | 216 | 54 | 21 |
| Chemical Liquid 10 | | 2052 | 1934 | 137 | 62 |
| Chemical Liquid 11 | | 554 | 928 | 32 | 46 |
| Chemical Liquid 12 | | 149 | 249 | 114 | 12 |
| Chemical Liquid 13 | | 294 | 505 | 126 | 12 |
| Chemical Liquid 14 | | 175 | 300 | 30 | 11 |
| Chemical Liquid 15 | | 438 | 608 | 65 | 50 |
| Chemical Liquid 16 | | 280 | 389 | 71 | 26 |
| Chemical Liquid 17 | | 498 | 865 | 48 | 18 |
| Chemical Liquid 18 | | 402 | 699 | 96 | 37 |
| Chemical Liquid 19 | | 143 | 221 | 100 | 10 |
| Chemical Liquid 20 | | 169 | 261 | 131 | 4 |

TABLE 17

| | Type of Chemical Liquid | Amount of Change in Resonance Frequency of Oscillator (Hz) (TiN adsorption layer) | Surface Inspection Device Evaluation (number of defects/wafer) (wafer surface: TiN) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 115 | 193 | 50 | 19 |
| Chemical Liquid 22 | | 18041 | 49559 | 1092 | 1019 |
| Chemical Liquid 23 | | 1865 | 3050 | 146 | 91 |
| Chemical Liquid 24 | | 1975 | 3230 | 160 | 71 |
| Chemical Liquid 25 | | 410 | 632 | 70 | 23 |
| Chemical Liquid 26 | | 207 | 320 | 59 | 28 |
| Chemical Liquid 27 | | 113 | 280 | 75 | 42 |
| Chemical Liquid 28 | PGMEA | 1526 | 3771 | 101 | 91 |
| Chemical Liquid 29 | | 130 | 233 | 80 | 6 |
| Chemical Liquid 30 | | 224 | 399 | 24 | 24 |
| Chemical Liquid 31 | | 514 | 861 | 134 | 25 |
| Chemical Liquid 32 | | 315 | 527 | 78 | 45 |
| Chemical Liquid 33 | IPA | 373 | 471 | 82 | 23 |
| Chemical Liquid 34 | | 223 | 261 | 26 | 21 |
| Chemical Liquid 35 | | 113 | 210 | 82 | 13 |
| Chemical Liquid 36 | | 6738 | 17309 | 448 | 417 |
| Chemical Liquid 37 | | 58 | 115 | 41 | 9 |
| Chemical Liquid 38 | CHN | 202 | 312 | 85 | 19 |
| Chemical Liquid 39 | | 148 | 248 | 109 | 20 |
| Chemical Liquid 40 | | 3790 | 8316 | 291 | 98 |
| Chemical Liquid 41 | | 215 | 374 | 79 | 10 |
| Chemical Liquid 42 | | 101 | 156 | 83 | 33 |
| Chemical Liquid 43 | | 2936 | 7011 | 206 | 148 |
| Chemical Liquid 44 | | 166 | 292 | 136 | 22 |

TABLE 18

| | Type of Chemical Liquid | Amount of Change in Resonance Frequency of Oscillator (Hz) (Ta adsorption layer) | Surface Inspection Device Evaluation (number of defects/wafer) (wafer surface: Ta) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 221 | 529 | 40 | 27 |
| Chemical Liquid 2 | | 226 | 542 | 31 | 37 |
| Chemical Liquid 3 | | 141 | 423 | 51 | 26 |
| Chemical Liquid 4 | | 403 | 1204 | 119 | 54 |
| Chemical Liquid 5 | | 1145 | 4567 | 105 | 85 |
| Chemical Liquid 6 | | 585 | 2345 | 139 | 61 |
| Chemical Liquid 7 | | 2180 | 8297 | 265 | 237 |
| Chemical Liquid 8 | | 258 | 771 | 121 | 44 |
| Chemical Liquid 9 | | 50 | 237 | 54 | 21 |
| Chemical Liquid 10 | | 1311 | 2127 | 137 | 62 |
| Chemical Liquid 11 | | 354 | 1021 | 32 | 46 |
| Chemical Liquid 12 | | 95 | 274 | 114 | 12 |
| Chemical Liquid 13 | | 185 | 556 | 126 | 12 |
| Chemical Liquid 14 | | 112 | 330 | 30 | 11 |
| Chemical Liquid 15 | | 280 | 669 | 65 | 50 |
| Chemical Liquid 16 | | 179 | 428 | 71 | 26 |
| Chemical Liquid 17 | | 318 | 951 | 48 | 18 |
| Chemical Liquid 18 | | 257 | 769 | 96 | 37 |
| Chemical Liquid 19 | | 91 | 243 | 100 | 10 |
| Chemical Liquid 20 | | 108 | 288 | 131 | 4 |

TABLE 19

| | Type of Chemical Liquid | Amount of Change in Resonance Frequency of Oscillator (Hz) (Ta adsorption layer) | Surface Inspection Device Evaluation (number of defects/wafer) (wafer surface: Ta) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 74 | 212 | 50 | 19 |
| Chemical Liquid 22 | | 11526 | 54515 | 1092 | 1019 |
| Chemical Liquid 23 | | 1191 | 3354 | 146 | 91 |
| Chemical Liquid 24 | | 1262 | 3553 | 160 | 71 |
| Chemical Liquid 25 | | 262 | 696 | 70 | 23 |
| Chemical Liquid 26 | | 132 | 352 | 59 | 28 |
| Chemical Liquid 27 | | 72 | 308 | 75 | 42 |
| Chemical Liquid 28 | PGMEA | 975 | 4148 | 101 | 91 |
| Chemical Liquid 29 | | 83 | 256 | 80 | 6 |
| Chemical Liquid 30 | | 143 | 439 | 24 | 24 |
| Chemical Liquid 31 | | 329 | 947 | 134 | 25 |
| Chemical Liquid 32 | | 201 | 580 | 78 | 45 |
| Chemical Liquid 33 | IPA | 238 | 518 | 82 | 23 |
| Chemical Liquid 34 | | 142 | 287 | 26 | 21 |
| Chemical Liquid 35 | | 72 | 231 | 82 | 13 |
| Chemical Liquid 36 | | 4305 | 19040 | 448 | 417 |
| Chemical Liquid 37 | | 37 | 127 | 41 | 9 |
| Chemical Liquid 38 | CHN | 129 | 344 | 85 | 19 |
| Chemical Liquid 39 | | 95 | 273 | 109 | 20 |
| Chemical Liquid 40 | | 2422 | 9148 | 291 | 98 |
| Chemical Liquid 41 | | 138 | 412 | 79 | 10 |
| Chemical Liquid 42 | | 64 | 171 | 83 | 33 |
| Chemical Liquid 43 | | 1876 | 7712 | 206 | 148 |
| Chemical Liquid 44 | | 106 | 322 | 136 | 22 |

TABLE 20

| | Type of Chemical Liquid | Amount of Change in Resonance Frequency of Oscillator (Hz) (TaN adsorption layer) | Surface Inspection Device Evaluation (number of defects/wafer) (wafer surface: TaN) | Pattern Defect Evaluation (number of defects/wafer) | Post-Washing Surface Inspection Device Defect Evaluation (number of defects/wafer) |
|---|---|---|---|---|---|
| Chemical Liquid 1 | nBA | 172 | 539 | 40 | 27 |
| Chemical Liquid 2 | | 176 | 553 | 31 | 37 |
| Chemical Liquid 3 | | 110 | 431 | 51 | 26 |
| Chemical Liquid 4 | | 313 | 1228 | 119 | 54 |
| Chemical Liquid 5 | | 892 | 4658 | 105 | 85 |
| Chemical Liquid 6 | | 458 | 2392 | 139 | 61 |
| Chemical Liquid 7 | | 1698 | 8463 | 265 | 237 |
| Chemical Liquid 8 | | 201 | 786 | 121 | 44 |
| Chemical Liquid 9 | | 39 | 242 | 54 | 21 |
| Chemical Liquid 10 | | 1021 | 2170 | 137 | 62 |
| Chemical Liquid 11 | | 276 | 1041 | 32 | 46 |
| Chemical Liquid 12 | | 74 | 279 | 114 | 12 |
| Chemical Liquid 13 | | 146 | 567 | 126 | 12 |
| Chemical Liquid 14 | | 87 | 336 | 30 | 11 |
| Chemical Liquid 15 | | 218 | 682 | 65 | 50 |
| Chemical Liquid 16 | | 139 | 437 | 71 | 26 |
| Chemical Liquid 17 | | 248 | 970 | 48 | 18 |
| Chemical Liquid 18 | | 200 | 784 | 96 | 37 |
| Chemical Liquid 19 | | 71 | 248 | 100 | 10 |
| Chemical Liquid 20 | | 84 | 293 | 131 | 4 |

TABLE 21

| | Type of Chemical Liquid | Amount of Change in Resonance Frequency of Oscillator (Hz) (TaN adsorption layer) | Surface Inspection Device Evaluation (number of defects/wafer) (wafer surface: TaN) | Pattern Defect Evaluation (number of defects/wafer) | Post-Washing Surface Inspection Device Defect Evaluation (number of defects/wafer) |
|---|---|---|---|---|---|
| Chemical Liquid 21 | MIBC | 57 | 216 | 50 | 19 |
| Chemical Liquid 22 | | 8977 | 55605 | 1092 | 1019 |
| Chemical Liquid 23 | | 928 | 3422 | 146 | 91 |
| Chemical Liquid 24 | | 983 | 3624 | 160 | 71 |
| Chemical Liquid 25 | | 204 | 710 | 70 | 23 |
| Chemical Liquid 26 | | 103 | 359 | 59 | 28 |
| Chemical Liquid 27 | | 56 | 315 | 75 | 42 |
| Chemical Liquid 28 | PGMEA | 759 | 4231 | 101 | 91 |
| Chemical Liquid 29 | | 65 | 261 | 80 | 6 |
| Chemical Liquid 30 | | 111 | 448 | 24 | 24 |
| Chemical Liquid 31 | | 256 | 966 | 134 | 25 |
| Chemical Liquid 32 | | 157 | 591 | 78 | 45 |
| Chemical Liquid 33 | IPA | 185 | 528 | 82 | 23 |
| Chemical Liquid 34 | | 111 | 293 | 26 | 21 |
| Chemical Liquid 35 | | 56 | 236 | 82 | 13 |
| Chemical Liquid 36 | | 3353 | 19421 | 448 | 417 |
| Chemical Liquid 37 | | 29 | 129 | 41 | 9 |
| Chemical Liquid 38 | CHN | 101 | 351 | 85 | 19 |
| Chemical Liquid 39 | | 74 | 278 | 109 | 20 |
| Chemical Liquid 40 | | 1886 | 9331 | 291 | 98 |
| Chemical Liquid 41 | | 107 | 420 | 79 | 10 |
| Chemical Liquid 42 | | 50 | 175 | 83 | 33 |
| Chemical Liquid 43 | | 1461 | 7866 | 206 | 148 |
| Chemical Liquid 44 | | 82 | 328 | 136 | 22 |

As shown in the above tables, in a case where the adsorption layers and the substrates made of the same metal types were used, the amount of change in the resonance frequency and the number of defects have a high correlation, and in a case where the amount of change in the resonance frequency is large, the number of defects tended to increase.

Furthermore, it was found that even in a case where the determination coefficient is 0.95 or more in regard to the correlation with the number of pattern defects or the number of defects in the post-washing surface inspection device defect evaluation and various layers other than the Si layer are used, the amount of change in the resonance frequency and the number of pattern defects or the number of defects have a higher correlation.

Example D

The amount of change in the resonance frequency was measured according to the same procedure as in [Evaluation Using Crystal Oscillator Sensor (1)] except that a Au layer was used instead of the Si layer.

Next, the amount of change in the resonance frequency obtained by using the Au layer was subtracted from the amount of change in the resonance frequency obtained by using the Si layer, and the difference was obtained. The results are shown in Table 22.

In Table 22, in the "Amount (Hz) Of Change in Resonance Frequency of Oscillator (Si—Au adsorption layer)" column, a difference obtained by subtracting the amount of change in the resonance frequency of the Au layer from the amount of change in the resonance frequency of the Si layer is shown.

In addition, the number of defects present on each substrate was measured by using a surface inspection device (SP-5; made by KLA Tencor) according to the same procedure as in [Evaluation Using Surface Inspection Device (1)] except that a Au layer was used instead of the Si layer. The results are shown in Table 23.

In addition, the evaluation was performed in a clean room that satisfies the cleanliness of Class 2 or higher defined by the International Standard ISO 14644-1: 2015 established by the International Organization for Standardization.

A lithography step using the chemical liquids 1 to 44 of Example B described above as a pre-wet liquid was performed by using a crystal oscillator sensor having a Si layer and a Au layer, and then defects on the pattern were evaluated.

In addition, the chemical liquids 1 to 44 of Example C described above were used as a washing solution with the use of a crystal oscillator sensor having a Si layer and a Au layer. The amount of change in the resonance frequency of the washing solution after washing was measured.

The results are also shown in Tables 22 and 23.

TABLE 22

| | Type of Chemical Liquid | Amount of Change in Resonance Frequency of Oscillator (Hz) (Si adsorption layer) | Amount of Change in Resonance Frequency of Oscillator (Hz) (Au adsorption layer) | Amount of Change in Resonance Frequency of Oscillator (Hz) (Si—Au adsorption layer) |
|---|---|---|---|---|
| Chemical Liquid 1 | nBA | 994 | 105 | 889 |
| Chemical Liquid 2 | | 1019 | 140 | 879 |
| Chemical Liquid 3 | | 636 | 8 | 628 |
| Chemical Liquid 4 | | 1811 | 24 | 1787 |
| Chemical Liquid 5 | | 5152 | 69 | 5083 |
| Chemical Liquid 6 | | 2646 | 35 | 2610 |
| Chemical Liquid 7 | | 9810 | 510 | 9300 |
| Chemical Liquid 8 | | 1159 | 15 | 1144 |
| Chemical Liquid 9 | | 223 | 3 | 220 |

TABLE 22-continued

| | Type of Chemical Liquid | Amount of Change in Resonance Frequency of Oscillator (Hz) (Si adsorption layer) | Amount of Change in Resonance Frequency of Oscillator (Hz) (Au adsorption layer) | Amount of Change in Resonance Frequency of Oscillator (Hz) (Si—Au adsorption layer) |
|---|---|---|---|---|
| Chemical Liquid 10 | | 5900 | 2669 | 3231 |
| Chemical Liquid 11 | | 1593 | 21 | 1572 |
| Chemical Liquid 12 | | 427 | 6 | 421 |
| Chemical Liquid 13 | | 846 | 11 | 835 |
| Chemical Liquid 14 | | 502 | 7 | 496 |
| Chemical Liquid 15 | | 1258 | 17 | 1241 |
| Chemical Liquid 16 | | 805 | 11 | 794 |
| Chemical Liquid 17 | | 1431 | 19 | 1412 |
| Chemical Liquid 18 | | 1157 | 15 | 1141 |
| Chemical Liquid 19 | | 411 | 5 | 405 |
| Chemical Liquid 20 | | 487 | 6 | 480 |
| Chemical Liquid 21 | MIBC | 331 | 4 | 326 |
| Chemical Liquid 22 | | 51868 | 692 | 51176 |
| Chemical Liquid 23 | | 5361 | 71 | 5290 |
| Chemical Liquid 24 | | 5678 | 76 | 5602 |
| Chemical Liquid 25 | | 1177 | 190 | 987 |
| Chemical Liquid 26 | | 595 | 8 | 587 |
| Chemical Liquid 27 | | 326 | 4 | 322 |
| Chemical Liquid 28 | PGMEA | 4387 | 58 | 4329 |
| Chemical Liquid 29 | | 374 | 5 | 369 |
| Chemical Liquid 30 | | 643 | 9 | 634 |
| Chemical Liquid 31 | | 1479 | 20 | 1459 |
| Chemical Liquid 32 | | 905 | 12 | 893 |
| Chemical Liquid 33 | IPA | 1071 | 182 | 889 |
| Chemical Liquid 34 | | 641 | 9 | 632 |
| Chemical Liquid 35 | | 326 | 4 | 322 |
| Chemical Liquid 36 | | 19371 | 471 | 18900 |
| Chemical Liquid 37 | | 167 | 2 | 164 |
| Chemical Liquid 38 | CHN | 582 | 8 | 574 |
| Chemical Liquid 39 | | 426 | 6 | 420 |
| Chemical Liquid 40 | | 10897 | 876 | 10021 |
| Chemical Liquid 41 | | 619 | 8 | 611 |
| Chemical Liquid 42 | | 290 | 4 | 286 |
| Chemical Liquid 43 | | 8442 | 113 | 8329 |
| Chemical Liquid 44 | | 476 | 6 | 470 |

TABLE 23

| | Surface Inspection Device Evaluation (number of defects/wafer) (wafer surface: Si) | Pattern Defect Evaluation (number of defects/wafer) | Post-Washing Surface Inspection Device Defect Evaluation (number of defects/wafer) |
|---|---|---|---|
| Chemical Liquid 1 | 10 | 40 | 27 |
| Chemical Liquid 2 | 10 | 31 | 37 |
| Chemical Liquid 3 | 8 | 51 | 26 |
| Chemical Liquid 4 | 23 | 119 | 54 |
| Chemical Liquid 5 | 86 | 105 | 85 |
| Chemical Liquid 6 | 44 | 139 | 61 |
| Chemical Liquid 7 | 156 | 265 | 237 |
| Chemical Liquid 8 | 14 | 121 | 44 |
| Chemical Liquid 9 | 4 | 54 | 21 |
| Chemical Liquid 10 | 40 | 137 | 62 |
| Chemical Liquid 11 | 19 | 32 | 46 |
| Chemical Liquid 12 | 5 | 114 | 12 |
| Chemical Liquid 13 | 10 | 126 | 12 |
| Chemical Liquid 14 | 6 | 30 | 11 |
| Chemical Liquid 15 | 13 | 65 | 50 |
| Chemical Liquid 16 | 8 | 71 | 26 |
| Chemical Liquid 17 | 18 | 48 | 18 |
| Chemical Liquid 18 | 14 | 96 | 37 |
| Chemical Liquid 19 | 5 | 100 | 10 |
| Chemical Liquid 20 | 5 | 131 | 4 |
| Chemical Liquid 21 | 4 | 50 | 19 |
| Chemical Liquid 22 | 1025 | 1092 | 1019 |
| Chemical Liquid 23 | 63 | 146 | 91 |
| Chemical Liquid 24 | 67 | 160 | 71 |
| Chemical Liquid 25 | 13 | 70 | 23 |
| Chemical Liquid 26 | 7 | 59 | 28 |
| Chemical Liquid 27 | 6 | 75 | 42 |
| Chemical Liquid 28 | 78 | 101 | 91 |
| Chemical Liquid 29 | 5 | 80 | 6 |
| Chemical Liquid 30 | 8 | 24 | 24 |
| Chemical Liquid 31 | 18 | 134 | 25 |
| Chemical Liquid 32 | 11 | 78 | 45 |
| Chemical Liquid 33 | 10 | 82 | 23 |
| Chemical Liquid 34 | 5 | 26 | 21 |
| Chemical Liquid 35 | 4 | 82 | 13 |
| Chemical Liquid 36 | 358 | 448 | 417 |
| Chemical Liquid 37 | 2 | 41 | 9 |
| Chemical Liquid 38 | 6 | 85 | 19 |
| Chemical Liquid 39 | 5 | 109 | 20 |
| Chemical Liquid 40 | 172 | 291 | 98 |

TABLE 23-continued

| | Surface Inspection Device Evaluation (number of defects/wafer) (wafer surface: Si) | Pattern Defect Evaluation (number of defects/wafer) | Post-Washing Surface Inspection Device Defect Evaluation (number of defects/wafer) |
|---|---|---|---|
| Chemical Liquid 41 | 8 | 79 | 10 |
| Chemical Liquid 42 | 3 | 83 | 33 |
| Chemical Liquid 43 | 145 | 206 | 148 |
| Chemical Liquid 44 | 6 | 136 | 22 |

As shown in Table 23, it was found that even in the crystal oscillator sensor having a Si layer and a Au layer, in a case where the determination coefficient is 0.95 or more in regard to the correlation with the number of pattern defects or the number of defects in the post-washing surface inspection device defect evaluation and the Au layer is used as a reference, the amount of change in the resonance frequency and the number of pattern defects or the number of defects have a higher correlation.

EXPLANATION OF REFERENCES

10: measuring device
12: flow cell unit
14: oscillation unit
14*a*: first oscillation unit
14*b*: second oscillation unit
15: detection unit
16: calculation unit
20: supply unit
18: memory
22: control unit
26: crystal oscillator sensor
27: crystal oscillator
27*a*: front surface
27*b*: back surface
28: temperature adjustment unit
29*a*: first tube
29*b*: second tube
30: electrode
30*a*: surface
31: electrode
34: adsorption layer
40: block
40*a*: supply passage
40*b*: discharge passage
40*c*, 42*a*: face
42, 43: seal portion
44: region
45: region
50: first electrode
51: second electrode
52: electrode
52*a*: first electrode portion
52*b*: second electrode portion
52*c*: connecting portion
60, 90: semiconductor manufacturing apparatus
61*a*: resist liquid supply unit
61*b*: rinsing liquid supply unit
61*c*: back rinsing unit
62*a*, 62*b*, 62*c*, 92: tank
64*a*, 64*b*, 64*c*, 94: pump
66*a*, 66*b*, 66*c*, 96: temperature adjuster
69*a*, 69*b*, 69*c*, 99: pipe
68*a*, 68*b*, 68*c*, 98: filter
70, 71, 72, 100: nozzle
80: application unit
82, 112: storage container
83, 114: support table
84, 115: drive shaft
85, 116: motor
86: semiconductor wafer
86*a*: front surface
86*b*: back surface
110: washing unit
L: calibration curve

What is claimed is:

1. A method of manufacturing a semiconductor device comprising:

Step 1 of bringing an oscillator into contact with a chemical liquid containing an organic solvent as a main component to obtain an amount of change in a resonance frequency of the oscillator resulting from the contact with the chemical liquid, wherein the oscillator includes a crystal oscillator sensor including an adsorption layer that adsorbs impurities in the chemical liquid and a crystal oscillator, and the adsorption layer is made of at least one material selected from the group including Si, Au, $SiO_2$, SiOC, Cu, Co, W, Ti, TiN, Ta, and TaN;

Step 2 of confirming whether or not an amount of change in the resonance frequency of the chemical liquid falls within a permissible range of an amount of change in the resonance frequency based on a preset purity of the chemical liquid; and Step 3 of using the chemical liquid confirmed in Step 2 in manufacturing a semiconductor device.

2. The method of manufacturing a semiconductor device according to claim 1, wherein the manufacturing of the semiconductor device in Step 3 has a lithography step using the chemical liquid.

3. The method of manufacturing a semiconductor device according to claim 1, further comprising a concentration step of concentrating the chemical liquid before Step 1.

4. The method of manufacturing a semiconductor device according to claim 1, further comprising a step of washing the oscillator before Step 1.

5. The method of manufacturing a semiconductor device according to claim 1, wherein in Step 1, the chemical liquid is circulated and supplied to the oscillator, and the oscillator is brought into contact with the chemical liquid to obtain the amount of change in a resonance frequency of the oscillator resulting from the contact with the chemical liquid.

6. The method of manufacturing a semiconductor device according to claim 1,
wherein Step 1 is performed while a temperature of the chemical liquid is kept constant.

7. The method of manufacturing a semiconductor device according to claim 1,
wherein the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

8. The method of manufacturing a semiconductor device according to claim 1,
wherein the oscillator further includes
an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

9. The method of manufacturing a semiconductor device according to claim 8,
wherein a supply unit that supplies the chemical liquid to the crystal oscillator sensor and brings the chemical liquid into contact with the crystal oscillator sensor is provided, and
Step 1 has a step of feeding the chemical liquid to the crystal oscillator sensor to bring the chemical liquid into contact with the crystal oscillator sensor.

10. The method of manufacturing a semiconductor device according to claim 8,
wherein the chemical liquid is allowed to flow in one direction to the crystal oscillator sensor to bring the chemical liquid into contact with the crystal oscillator sensor.

11. The method of manufacturing a semiconductor device according to claim 1,
wherein in Step 1, at least a part of a liquid contact portion coming into contact with the chemical liquid is made of a fluorine-based resin.

12. A method of washing a semiconductor manufacturing apparatus comprising:
Step 1 of bringing an oscillator into contact with a chemical liquid containing an organic solvent as a main component to obtain an amount of change in a resonance frequency of the oscillator resulting from the contact with the chemical liquid, wherein the oscillator includes a crystal oscillator sensor including an adsorption layer that adsorbs impurities in the chemical liquid and a crystal oscillator, and the adsorption layer is made of at least one material selected from the group including Si, Au, $SiO_2$, SiOC, Cu, Co, W, Ti, TiN, Ta, and TaN;
Step 2 of confirming whether or not an amount of change in the resonance frequency of the chemical liquid falls within a permissible range of an amount of change in the resonance frequency based on a preset purity of the chemical liquid; and
Step 3 of using the chemical liquid confirmed in Step 2 in washing a semiconductor manufacturing apparatus.

13. The method of washing a semiconductor manufacturing apparatus according to claim 12,
wherein the washing of the semiconductor manufacturing apparatus in Step 3 has a step of feeding the chemical liquid to a liquid feeding unit of the semiconductor manufacturing apparatus.

14. The method of washing a semiconductor manufacturing apparatus according to claim 12, further comprising a concentration step of concentrating the chemical liquid before Step 1.

15. The method of washing a semiconductor manufacturing apparatus according to claim 12, further comprising a step of washing the oscillator before Step 1.

16. The method of washing a semiconductor manufacturing apparatus according to claim 12,
wherein in Step 1, the chemical liquid is circulated and supplied to the oscillator, and the oscillator is brought into contact with the chemical liquid to obtain the amount of change in a resonance frequency of the oscillator resulting from the contact with the chemical liquid.

17. The method of washing a semiconductor manufacturing apparatus according to claim 12,
wherein Step 1 is performed while a temperature of the chemical liquid is kept constant.

18. The method of washing a semiconductor manufacturing apparatus according to claim 12,
wherein the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

19. The method of washing a semiconductor manufacturing apparatus according to claim 12,
wherein the oscillator further includes
an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

20. The method of washing a semiconductor manufacturing apparatus according to claim 19,
wherein a supply unit that supplies the chemical liquid to the crystal oscillator sensor and brings the chemical liquid into contact with the crystal oscillator sensor is provided, and
Step 1 has a step of feeding the chemical liquid to the crystal oscillator sensor to bring the chemical liquid into contact with the crystal oscillator sensor.

21. The method of washing a semiconductor manufacturing apparatus according to claim 19,
wherein the chemical liquid is allowed to flow in one direction to the crystal oscillator sensor to bring the chemical liquid into contact with the crystal oscillator sensor.

22. The method of washing a semiconductor manufacturing apparatus according to claim 12,
wherein in Step 1, at least a part of a liquid contact portion coming into contact with the chemical liquid is made of a fluorine-based resin.

23. A method of measuring cleanliness of a washing solution comprising:
Step 1 of bringing an oscillator into contact with a chemical liquid containing an organic solvent as a main component to obtain an amount of change in a resonance frequency of the oscillator resulting from the contact with the chemical liquid;
Step 2 of confirming whether or not an amount of change in the resonance frequency of the chemical liquid falls within a permissible range of an amount of change in the resonance frequency based on a preset purity of the chemical liquid;

Step 3 of using the chemical liquid confirmed in Step 2 in washing a semiconductor manufacturing apparatus;

Step 4 of extracting a part of the chemical liquid used for washing in Step 3; and Step 5 of confirming whether or not the amount of change in the resonance frequency of the chemical liquid extracted in Step 4 falls within the permissible range.

24. The method of measuring cleanliness of a washing solution according to claim 23, further comprising a concentration step of concentrating the chemical liquid before Step 1.

25. The method of measuring cleanliness of a washing solution according to claim 23, further comprising a step of washing the oscillator before Step 1.

26. The method of measuring cleanliness of a washing solution according to claim 23, wherein in Step 1, the chemical liquid is circulated and supplied to the oscillator, and the oscillator is brought into contact with the chemical liquid to obtain the amount of change in a resonance frequency of the oscillator resulting from the contact with the chemical liquid.

27. The method of measuring cleanliness of a washing solution according to claim 23, wherein Step 1 is performed while a temperature of the chemical liquid is kept constant.

28. The method of measuring cleanliness of a washing solution according to claim 23, wherein the chemical liquid in Step 1 contains at least one metal element selected from the group consisting of Na, K, Ca, Fe, Cu, Mg, Mn, Li, Al, Cr, Ni, Ti, and Zn, and a total content of the metal elements is 0.01 mass ppq to 10 mass ppb.

29. The method of measuring cleanliness of a washing solution according to claim 23, wherein the oscillator includes a crystal oscillator sensor including an adsorption layer that adsorbs impurities in the chemical liquid and a crystal oscillator, and an oscillation unit that oscillates the oscillator at a resonance frequency, and a detection unit that is connected to the crystal oscillator sensor and detects an amount of change in the resonance frequency of the crystal oscillator resulting from the contact with the chemical liquid are provided.

30. The method of measuring cleanliness of a washing solution according to claim 29, wherein a supply unit that supplies the chemical liquid to the crystal oscillator sensor and brings the chemical liquid into contact with the crystal oscillator sensor is provided, and Step 1 has a step of feeding the chemical liquid to the crystal oscillator sensor to bring the chemical liquid into contact with the crystal oscillator sensor.

31. The method of measuring cleanliness of a washing solution according to claim 29, wherein the chemical liquid is allowed to flow in one direction to the crystal oscillator sensor to bring the chemical liquid into contact with the crystal oscillator sensor.

32. The method of measuring cleanliness of a washing solution according to claim 23, wherein in Step 1, at least a part of a liquid contact portion coming into contact with the chemical liquid is made of a fluorine-based resin.

* * * * *